United States Patent
Monreal et al.

(10) Patent No.: US 9,664,752 B2
(45) Date of Patent: May 30, 2017

(54) MAGNETIC FIELD SENSOR FOR DETECTING A MAGNETIC FIELD IN ANY DIRECTION ABOVE THRESHOLDS

(71) Applicant: Allegro Microsystems, LLC, Worcester, MA (US)

(72) Inventors: Gerardo A. Monreal, Buenos Aires (AR); Bruno Luis Uberti, Ciudad de Buenos Aires (AR)

(73) Assignee: Allegro Microsystems, LLC, Worcester, MA (US)

( * ) Notice: Subject to any disclaimer, the term of this patent is extended or adjusted under 35 U.S.C. 154(b) by 372 days.

(21) Appl. No.: 14/277,218

(22) Filed: May 14, 2014

(65) Prior Publication Data
US 2014/0347044 A1 Nov. 27, 2014

Related U.S. Application Data

(60) Provisional application No. 61/827,280, filed on May 24, 2013.

(51) Int. Cl.
*G01R 33/07* (2006.01)
*G01R 33/00* (2006.01)
*G01R 33/02* (2006.01)

(52) U.S. Cl.
CPC ......... *G01R 33/07* (2013.01); *G01R 33/0023* (2013.01); *G01R 33/0206* (2013.01)

(58) Field of Classification Search
CPC ...................................................... G01R 33/07
USPC ........................................................ 324/251
See application file for complete search history.

(56) References Cited

U.S. PATENT DOCUMENTS

| | | |
|---|---|---|
| 3,846,697 A | 11/1974 | Cila et al. |
| 4,204,158 A | 5/1980 | Ricouard et al. |
| 4,296,410 A | 10/1981 | Higgs et al. |
| 4,349,814 A | 9/1982 | Akehurst |
| 4,355,209 A | 10/1982 | Sabon |

(Continued)

FOREIGN PATENT DOCUMENTS

| | | |
|---|---|---|
| EP | 0 631 413 A2 | 12/1994 |
| JP | 62-48160 | 3/1987 |

(Continued)

OTHER PUBLICATIONS

Ramsden; "Hall-Effect Sensors: Theory and Applications;" Hall-Effect Sensors: Theory and Applications; ISBN:978-0-75-067934-3; XP055039221; Jan. 1, 2006; 253 pages.

(Continued)

*Primary Examiner* — Bot Ledynh
(74) *Attorney, Agent, or Firm* — Daly, Crowley, Mofford & Durkee, LLP

(57) ABSTRACT

A magnetic field sensor includes first, second, and third magnetic field sensing elements having respective first, second and third maximum response axes, the first second and third maximum response axes pointing along respective first, second, and third different coordinate axes. In response to a magnetic field, the first, second, and third magnetic field sensing elements are operable to generate first second, and third magnetic field signals. Signals representative of the first, second, and third magnetic field signals are compared with thresholds to determine if the magnetic field is greater than the thresholds. A corresponding method is also provided.

48 Claims, 15 Drawing Sheets

(56) References Cited

U.S. PATENT DOCUMENTS

| | | | |
|---|---|---|---|
| 4,745,363 | A | 5/1988 | Carr et al. |
| 4,761,569 | A | 8/1988 | Higgs |
| 4,859,941 | A | 8/1989 | Higgs et al. |
| 4,966,041 | A | 10/1990 | Miyazaki |
| 5,402,064 | A | 3/1995 | Eck et al. |
| 5,442,283 | A | 8/1995 | Vig et al. |
| 5,493,690 | A | 2/1996 | Shimazaki |
| 5,541,562 | A | 7/1996 | Fletcher et al. |
| 5,570,016 | A | 10/1996 | Schroeder et al. |
| 5,629,622 | A | 5/1997 | Scampini |
| 5,666,410 | A | 9/1997 | McLane |
| 5,686,894 | A | 11/1997 | Vig et al. |
| 5,789,915 | A | 8/1998 | Ingraham |
| 5,861,796 | A | 1/1999 | Benshoff |
| 5,867,021 | A | 2/1999 | Hancock |
| 6,014,008 | A | 1/2000 | Hartzell et al. |
| 6,035,211 | A | 3/2000 | Rabe et al. |
| 6,356,741 | B1 | 3/2002 | Bilotti et al. |
| 6,622,012 | B2 | 9/2003 | Bilotti et al. |
| 7,085,119 | B2 | 8/2006 | Bilotti et al. |
| 7,307,824 | B2 | 12/2007 | Bilotti et al. |
| 7,768,083 | B2 | 8/2010 | Doogue et al. |
| 7,990,209 | B2 | 8/2011 | Romero |
| 8,222,888 | B2 | 7/2012 | David et al. |
| 8,564,285 | B2 | 10/2013 | Romero et al. |
| 8,629,520 | B2 | 1/2014 | Doogue et al. |
| 8,680,846 | B2 | 3/2014 | Cesaretti et al. |
| 2003/0107510 | A1* | 6/2003 | Gartner et al. ............... 341/158 |
| 2006/0097715 | A1* | 5/2006 | Oohira et al. ............. 324/207.2 |
| 2009/0251316 | A1 | 10/2009 | Mamourian et al. |
| 2011/0031968 | A1 | 2/2011 | Cantave et al. |
| 2011/0234218 | A1* | 9/2011 | Lagouge ........................ 324/247 |
| 2011/0248790 | A1* | 10/2011 | Tsvey ............................ 333/101 |
| 2013/0057257 | A1 | 3/2013 | Friedrich et al. |
| 2014/0009144 | A1 | 1/2014 | Romero |
| 2014/0239942 | A1 | 8/2014 | Schaaf |

FOREIGN PATENT DOCUMENTS

| | | |
|---|---|---|
| JP | 7-15493 | 1/1995 |
| JP | 9-294060 | 11/1997 |
| JP | 7-83699 | 3/1998 |

OTHER PUBLICATIONS

PCT International Preliminary Report on Patentability of the ISA dated Sep. 4, 2014; for PCT Pat. App. No. PCT/US2014/037967; 18 pages.

U.S. Appl. No. 13/766,341, filed Feb. 13, 2013, Romero et al.

Allegro Data Sheet 3235; "Dual-Output Hall-Effect Switch;" Jan. 1995; 9 pages.

AsahiKasei; "AK8777B Hall Effect IC for Pulse Encoders;" Distributed by GMW Associates; Sep. 2012; 10 pages.

Kejik et al.; "First Fully CMOS-Integrated 3D Hall Probe;" $13^{th}$ International Conference on Solid-State Sensors, Actuators and Microsystems; Jun. 5-9, 2005; 4 pages.

Office Acton dated Jul. 9, 2001; for U.S. Appl. No. 09/338,668; 8 pages.

Response filed Oct. 9, 2010; Office Action dated Jul. 9, 2001; for U.S. Appl. No. 09/338,668; 20 pages.

Office Action dated Dec. 31, 2002; for U.S. Appl. No. 09/997,148; 8 pages.

Terminal Disclaimer dated Mar. 31, 2003; for U.S. Appl. No. 09/997,148; 2 pages.

Response to Office Action filed Mar. 31, 2003; for U.S. Appl. No. 09/997,148; 14 pages.

Image File Wrapper downloaded May 21, 2014; for U.S. Pat. No. 7,085,119; issued on Aug. 1, 2006; 188 pages.

Image File Wrapper downloaded May 21, 2014; for U.S. Pat. No. 7,307,824; issued on Dec. 11, 2007; 102 pages.

PCT International Preliminary Report on Patentability and Written Opinion of the ISA dated Dec. 3, 2015; For PCT Pat. App. No. PCT/US2014/037967; 14 pages.

PCT Search Report and Written Opinion of the ISA fo PCT/US2016/044957, dated Oct. 13, 2016; 20 pages.

Sander et al., "Isotropic 3D Silicon Hall Sensor", from MEMS, 2015, Estoril, Portugal, Jan. 18, 2015; 4 pages.

Response (with amended claims) to European Office Action dated Jan. 11, 2016 for European Pat. App. No. 14730350.7; Response filed Jul. 7, 2016; 22 pages.

U.S. Non-Final Office Action dated Feb. 3, 2017 for U.S. Appl. No. 14/830,098; 34 Pages.

\* cited by examiner

MAGNETIC FIELD SENSOR FOR DETECTING A MAGNETIC FIELD IN ANY DIRECTION ABOVE THRESHOLDS

CROSS REFERENCE TO RELATED APPLICATIONS

This application claims the benefit under 35 U.S.C. §119(e) of U.S. Provisional Application No. 61/827,280 filed May 24, 2013, which application is incorporated herein by reference in its entirety.

STATEMENT REGARDING FEDERALLY SPONSORED RESEARCH

Not Applicable.

FIELD

This invention relates generally to magnetic field sensors and, more particularly, to a magnetic field sensor in the form of a magnetic switch that can sense a magnetic field in three dimensions being above thresholds.

BACKGROUND

As is known, there are a variety of types of magnetic field sensing elements, including, but not limited to, Hall Effect elements, magnetoresistance elements, and magnetotransistors. As is also known, there are different types of Hall Effect elements, for example, planar Hall elements, vertical Hall elements, and circular Hall elements. As is also known, there are different types of magnetoresistance elements, for example, anisotropic magnetoresistance (AMR) elements, giant magnetoresistance (GMR) elements, tunneling magnetoresistance (TMR) elements, Indium antimonide (InSb) elements, and magnetic tunnel junction (MTJ) elements.

Hall Effect elements generate an output voltage proportional to a magnetic field. In contrast, magnetoresistance elements change resistance in proportion to a magnetic field. In a circuit, an electrical current can be directed through the magnetoresistance element, thereby generating a voltage output signal proportional to the magnetic field.

Magnetic field sensors, which use magnetic field sensing elements, are used in a variety of applications, including, but not limited to, a current sensor that senses a magnetic field generated by a current carried by a current-carrying conductor, a magnetic switch (also referred to herein as a proximity detector) that senses the proximity of a ferromagnetic or magnetic object, a rotation detector that senses passing ferromagnetic articles, for example, gear teeth, and a magnetic field sensor that senses a magnetic field density of a magnetic field. Magnetic switches are used as examples herein. However, the circuits and techniques described herein apply also to any magnetic field sensor.

Conventional magnetic switches can sense a magnetic field above a threshold level in one dimension, i.e., along a line. Some conventional magnetic switches can sense a magnetic field above a threshold in two dimensions, i.e., in a plane.

It would be desirable to provide a magnetic switch that can sense a magnetic field above a threshold in any dimension.

SUMMARY

The present invention provides a magnetic switch that can sense a magnetic field above a threshold in any dimension.

In accordance with one aspect, a magnetic field sensor includes first, second, and third magnetic field sensing elements having respective first, second and third maximum response axes, the first second and third maximum response axes pointing along respective first, second, and third different coordinate axes. In response to a magnetic field, the first, second, and third magnetic field sensing elements are operable to generate first second, and third magnetic field signals. The magnetic field sensor also includes an electronic circuit coupled to receive the first, second, and third magnetic field signals. The electronic circuit includes a threshold generator configured to generate first, second, and third operating point thresholds. The electronic circuit also includes one or more comparators configured to compare signals related to the first, second, and third magnetic field signals with the first, second, and third operating point thresholds, respectively, wherein a respective one or more of one or more comparator output signals changes state to a first state if a respective one or more of the signals related to the first, second, and third magnetic field signals has a magnitude above a respective one of the first, second, and third operating point thresholds.

In accordance with another aspect, a method of measuring a magnetic field with a magnetic field sensor includes providing, on a common substrate, first, second, and third magnetic field sensing elements having respective first, second and third maximum response axes, the first second and third maximum response axes pointing along respective first, second, and third different coordinate axes. In response to a magnetic field, the first, second, and third magnetic field sensing elements are operable to generate first second, and third magnetic field signals. The method also includes providing, on the common substrate, an electronic circuit coupled to receive the first, second, and third magnetic field signals. The providing the electronic circuit includes providing a threshold generator configured to generate first, second, and third operating point thresholds. The providing the electronic circuit also includes providing one or more comparators configured to compare signals related to the first, second, and third magnetic field signals with the first, second, and third operating point thresholds, respectively, wherein a respective one or more of one or more comparator output signals changes state to a first state if a respective one or more of the signals related to the first, second, and third magnetic field signals has a magnitude above a respective one of the first, second, and third operating point thresholds.

BRIEF DESCRIPTION OF THE DRAWINGS

The foregoing features of the invention, as well as the invention itself may be more fully understood from the following detailed description of the drawings, in which.

DETAILED DESCRIPTION

As used herein, the term "magnetic field sensing element" is used to describe a variety of electronic elements that can sense a magnetic field. The magnetic field sensing element can be, but is not limited to, a Hall Effect element, a magnetoresistance element, or a magnetotransistor. As is known, there are different types of Hall Effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As is known, some of the above-described magnetic field sensing elements tend to have an axis of maximum sensitivity in the plane of a substrate that supports the magnetic field sensing element, and others of the above-described magnetic field sensing elements tend to have an axis of maximum sensitivity normal to a substrate that supports the magnetic field sensing element. In particular, planar Hall elements tend to have axes of sensitivity normal to a substrate, while metal based or metallic magnetoresistance elements (e.g., GMR, TMR, AMR) and vertical Hall elements tend to have axes of sensitivity in the plane of the substrate.

As used herein, the term "magnetic field sensor" is used to describe a circuit that uses a magnetic field sensing element, generally in combination with other circuits. Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic field sensor is used in combination with a back-biased or other magnet, and a magnetic field sensor that senses a magnetic field density of a magnetic field.

Figures 1, 2, 2A:
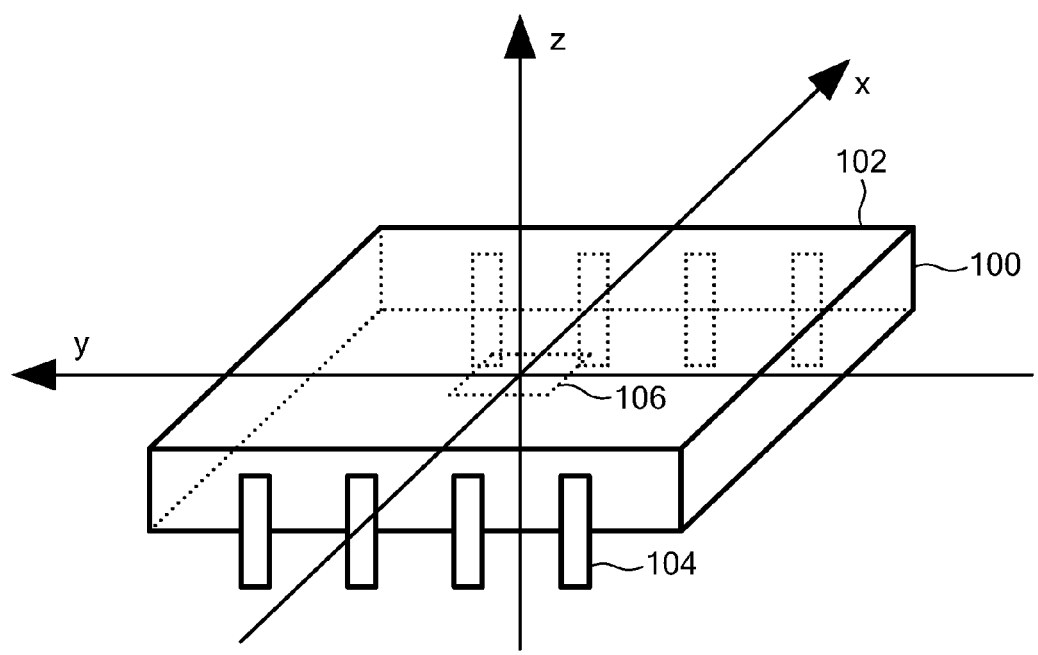
FIG. 1 is a pictorial showing an integrated circuit having a magnetic field sensor therein disposed upon a substrate, and showing three coordinate axes.
FIG. 2, which includes FIGS. 2A, 2B, and 2C in combination, is a block diagram showing an exemplary magnetic field sensor, in the form of a magnetic switch, which can be used as the magnetic field sensor of FIG. 1, which has a planar Hall element and two vertical Hall elements, and which has a so-called omni comparator.
Figure 2A:
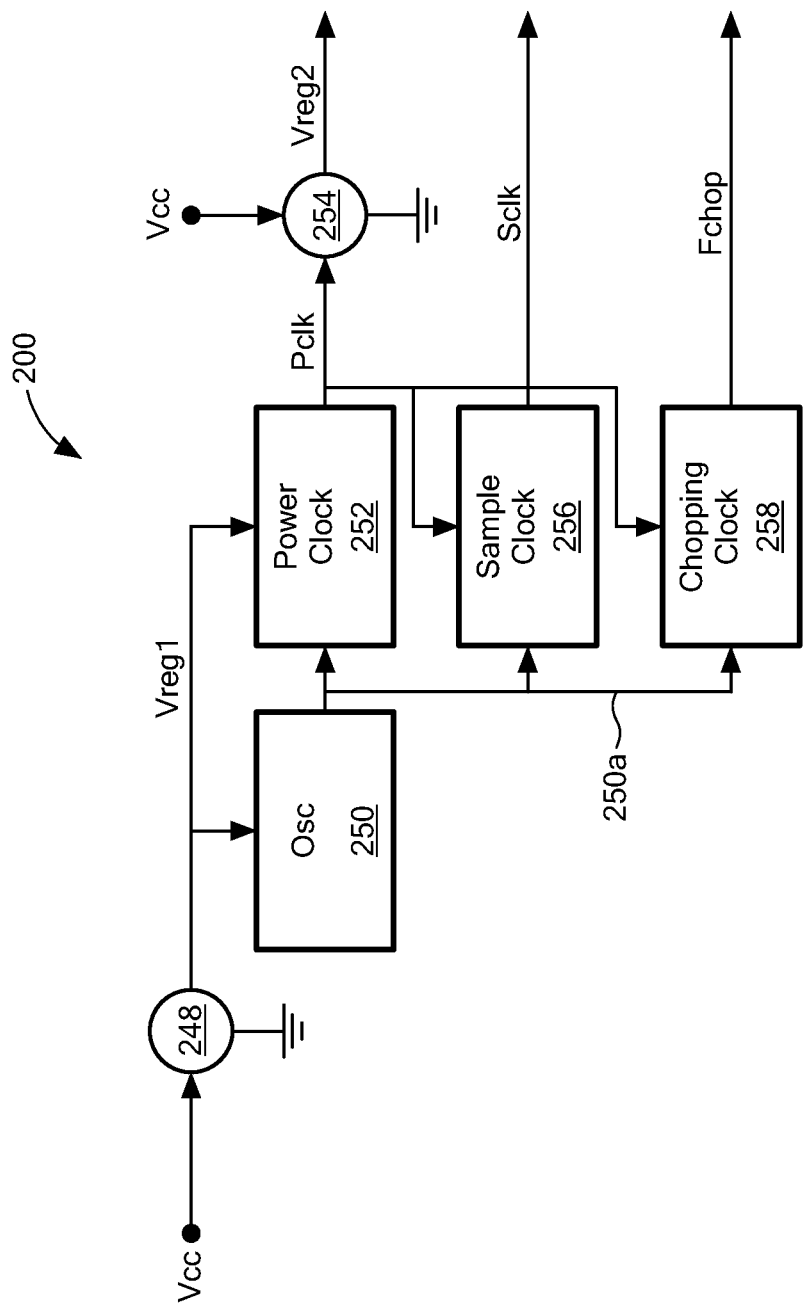
Figure 2B:
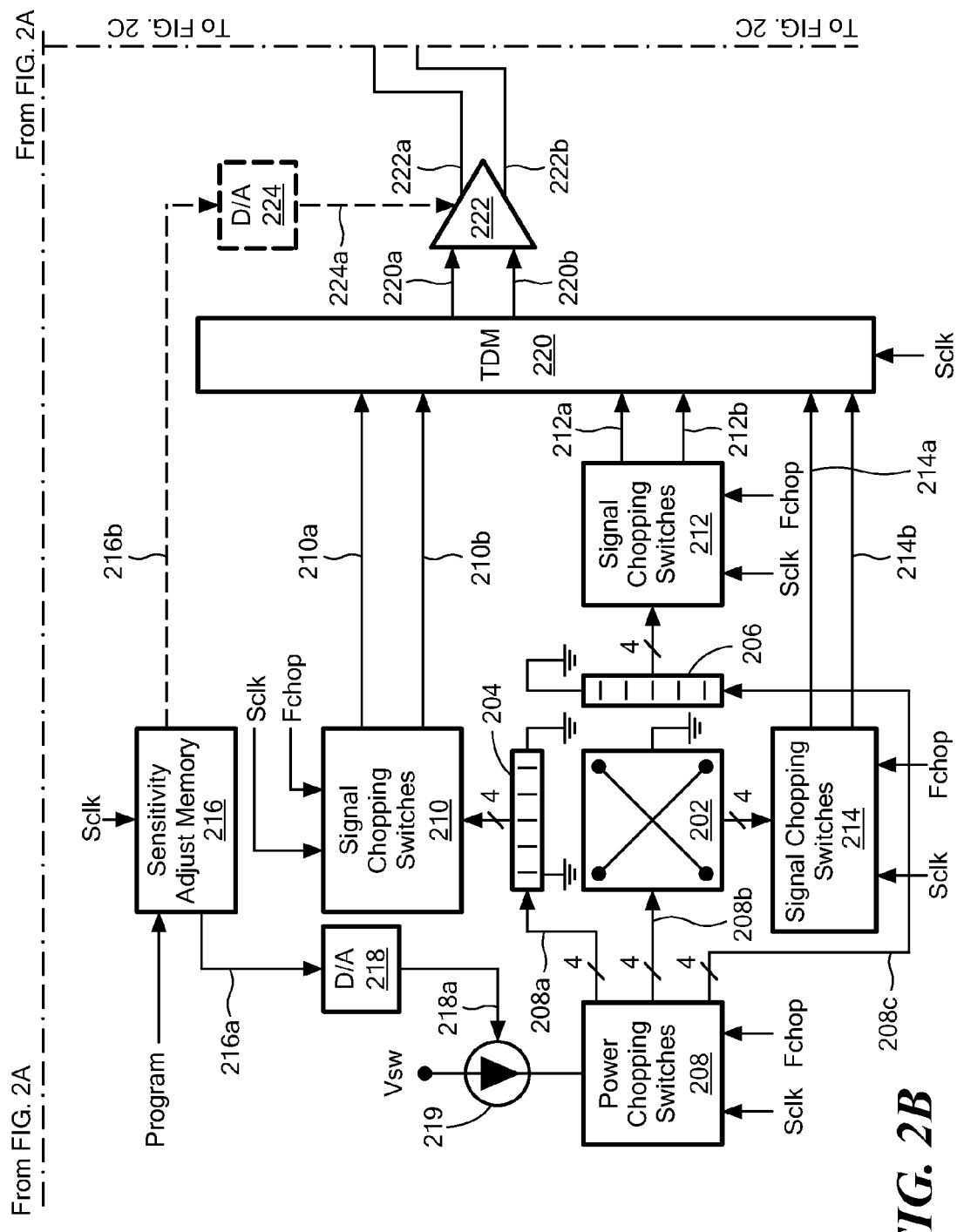
Figure 2C:
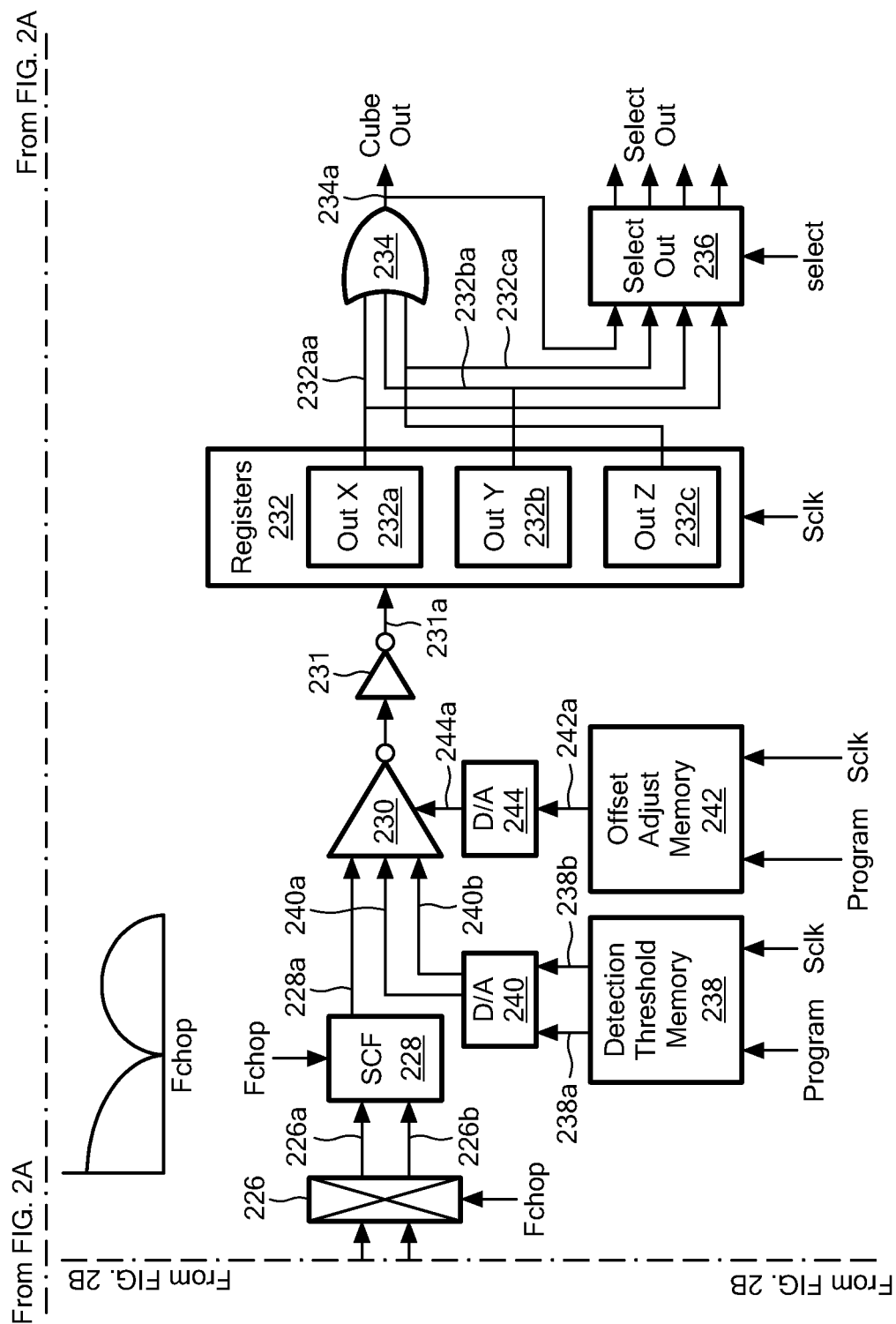

Referring to FIG. 1, an exemplary integrated circuit 100 includes a housing 102, for example, a plastic housing, a plurality of leads, of which a lead 104 is one example, and an integrated circuit substrate 106, for example, a semiconductor substrate upon which a magnetic field sensor can be disposed.

An x, y, z Cartesian coordinate system is shown and will be referenced in figures that follow.

Referring now to FIG. 2, an exemplary magnetic field sensor 200, in the form of magnetic switch, includes a planar (or horizontal) Hall element 202, which has a maximum response axis directed out of the page. The magnetic field sensor 200 also includes a first vertical Hall element 204 with a maximum response axis directed up and down on the page when the page is held in landscape mode. The magnetic field sensor 200 also includes a second vertical Hall element 206 with a maximum response axis directed right to left on the page when the page is held in landscape mode.

It is intended that the maximum response axis of the planar Hall element 202 points in the direction of the z-axis of FIG. 1. It is intended that the maximum response axis of the first vertical Hall element 204 points in the direction of the x-axis of FIG. 1. It is further intended that the maximum response axis of the second vertical Hall element 206 points in the direction of the y-axis of FIG. 1.

While orthogonal Cartesian coordinates are shown and described herein, it should be appreciated that orientations of the maximum response axes of the planar Hall element 202, the first vertical Hall element 204, and the second vertical Hall element 206 need not point in orthogonal directions. Orthogonal directions are merely used as an example herein.

It is known that Hall elements tend to generate an output voltage signal that has both a magnetically responsive signal portion and an unwanted DC offset signal portion. Current spinning (also referred to as chopping) is a known technique used to reduce the offset signal portion. Chopping can be applied to both planar Hall elements and vertical Hall elements. With chopping, selected drive and signal contact pairs are interchanged during each phase of the chopping.

Chopping tends to result in a frequency domain separation of the magnetically responsive signal portion of an output signal from a Hall element with respect to the offset signal portion of the output signal from the Hall element. In so-called "signal modulation," the magnetically responsive signal portion is shifted to a higher frequency and the offset signal portion remains at baseband. In so-called "offset modulation," the offset signal portion is shifted to a higher frequency and the magnetically responsive signal portion remains at baseband. For a planar Hall element, these two types of chopping are described, for example, in U.S. patent application Ser. No. 13/095,371, filed Apr. 27, 2011, entitled "Circuits and Methods for Self-Calibrating or Self-Testing a Magnetic Field Sensor." For a vertical Hall element, chopping is described in U.S. patent application Ser. No. 13/766,341, filed Feb. 13, 2013, entitled "Magnetic Field Sensor And Related Techniques That Provide Varying Current Spinning Phase Sequences Of A Magnetic Field Sensing Element." Both of these applications are assigned to the assignee of the present application and both are incorporated by reference herein in their entirety.

The signal modulation type chopping is described in figures herein. However, in other embodiments, the offset modulation type of chopping can be used.

Furthermore, magnetic field sensor are shown herein that employ chopping arrangements, in other embodiments, no chopping is used, In accordance with the above-described chopping, power chopping switches 208 apply chopped drive signals 208b to the planar Hall element 202, chopped drive signals 208a to the first vertical Hall element 204, and chopped drive signals 208c to the second vertical Hall element 206. The chopped drive signals change phases at a rate determined by a clock signal with a frequency, Fchop. The power chopping switches 208 also receive the sample clock, Sclk, signal. It will become apparent from discussion below in conjunction with FIG. 3 that the power chopping switches can decode the sample clock, Sclk, and can apply the chopped drive signals 208a, 208b, 208c sequentially and one at a time so that only one of the three Hall elements is operational at a time.

Also in accordance with the above-described chopping, signal chopping switches 214 select signal contacts of the planar Hall element 202, signal chopping switches 210 select signal contacts of the first vertical Hall element 204, and signal chopping switches 212 select signal contacts of the second vertical Hall element 212. As described in further detail below, the chopping, and operation of the planar Hall element 202, the first vertical Hall element 204, and the second vertical Hall element 206 occur from time to time in accordance with the sample clock, Sclk, received by the power chopping switches 208 and by the various signal chopping switches 210, 212, 214.

The signal chopping switches 210, 212, 214 are also coupled to receive the chopping frequency clock, Fchop, described more fully below.

A time division multiplex module 220 is coupled to receive three different differential signals 210a, 210b, and 212a, 212b, and 214a, 214b from the signal chopping switches 210, 212, 214. The time division multiplex module 220 is also coupled to receive the sample clock, Sclk. It will be appreciated that the three differential signals 210a, 210b, and 212a, 212b, and 214a, 214b are chopped signals, for which the magnetically responsive signal portion can be shifted to a higher frequency in accordance with the chopping frequency, Fchop. The unwanted offset signal portion remains at baseband within the three differential signals 210a, 210b, and 212a, 212b, and 214a, 214b.

While differential signals are described above and below, it will be appreciated that, in other embodiments, similar circuits can be designed that use single ended signals.

The time division multiplex module 220 is configured to sequentially select from among the three different differential signals 210a, 210b, and 212a, 212b, and 214a, 214b and to provide a differential sequential signal at an output therefrom, which is representative of sequential ones of the three differential signals 210a, 210b, and 212a, 212b, and 214a, 214b received by the time division multiplex module 220.

An amplifier 222 is coupled to receive the differential sequential signal 220a, 220b from the time division multiplex module 220 and is configured to generate a differential amplified signal 222a, 222b.

A modulator 226 is coupled to receive the differential amplified signal 222a, 222b and to generate a differential modulated signal 224a, 224b. The modulator 226 is operable to do another frequency conversion, i.e., to shift a frequency of the magnetically responsive signal portion back to baseband, and to shift the offset signal portion up to higher frequency in accordance with the chopping frequency, Fchop. It should be appreciated that, the modulator 226 also operates to shift an unwanted offset generated by the amplifier 222 up to the higher frequency. Thus, the differential modulated signal 226a, 226b generated by the modulator 226 has unwanted offset signal portions shifted to a higher frequency and the magnetically responsive signal portion, which is desired, is at baseband.

The differential modulated signal 226a, 226b generated by the modulator 226 can be received by a filter, here, a switched capacitor filter 228, which is an analog sampled filter. In some embodiments the switched capacitor filter 228 is a switched capacitor notch filter, which has a transfer function with a first notch at the chopping frequency, Fchop. The filter 228 essentially removes the unwanted offset signal portion that occurs in the differential modulated signal 226a, 226b at the frequency, Fchop.

An exemplary switched capacitor notch filter is described in U.S. Pat. No. 7,990,209, issued Aug. 2, 2011, entitled "Switched Capacitor Notch Filter," which is assigned to the assignee of the present invention and incorporated by reference herein in its entirety.

The switched capacitor filter 228 is configured to generate a filtered signal 228a, which is received by a comparator 230, referred to herein as an omni comparator for reasons that will be apparent from discussion below. The omni comparator 230 is described more fully below in conjunction with FIG. 4.

From discussion above, in accordance with a sampling clock signal, Sclk, received by the time division multiplex module 220, it will be apparent that the filtered signal 228a provided by the switched capacitor filter 228 is, at some sequential times, representative of a signal generated by the planar Hall element 202, at some other sequential times representative of a signal generated by the first vertical Hall element 204, and at some other sequential times representative of a signal generated by the second vertical Hall element 206.

The omni comparator 230 is coupled to receive threshold signals 240a, 240b from a digital to analog converter 240. In some embodiments, the threshold signals 240a, 240b can be the same for each one of the sequential signals described above and provided by the switched capacitor filter 228, or different thresholds can be provided for each one of the sequential signals described above and provided by the switched capacitor filter 228.

The comparator 230 is configured to generate a comparison signal received by an inverter 231, which generates an inverted comparison signal 231a received by registers 232.

The registers 232 are also coupled to receive the sample clock signal, Sclk. The registers are operable, by way of decoding the sample clock signal, Sclk, to sequentially store comparison values (e.g., zero or one) corresponding to the comparisons of the sequential signals 228a provided by the switch capacitor filter 228 with appropriate thresholds 240a, 240b. Thus, in some embodiments, a comparison value can be stored in a register 232a that is representative of a sensed magnetic field in an x direction being above a threshold signal, another comparison value can be stored in a register 232b that is representative of the sensed magnetic field in a y direction being above a threshold signal, and another comparison value can be stored in a register 232c that is representative of the sensed magnetic field in a z direction being above a threshold signal. As described above the threshold signals 240a, 240b can be the same or they can be different for each one of the Hall elements.

As is described in conjunction with FIG. 4 below, the omni comparator 230 uses the threshold signals 240a, 240b to result in two bidirectional operating point thresholds and two bidirectional release point thresholds. Thus, a first state of the comparison values (e.g., one or high state) can be representative of a sensed magnetic field being greater than a corresponding operating point threshold in one of two parallel directions (e.g., along the x, y, or z axes of FIG. 1) represented by the sample signal 228a. A second different state of the comparison values (e.g., zero or low state) can be representative of the sensed magnetic field being below a corresponding release point threshold in one of the two parallel directions. The thresholds are further described below in conjunction with FIG. 6.

The registers 232 provide output values 232aa, 232ba, 232ca. A logic gate 234 is coupled to receive the output values 232aa, 232ba, 232ca. If any one of the output values 232aa, 232ba, 232ca is indicative of a magnetic field being above an associated operating point threshold in a direction of a corresponding coordinate axis, an output signal 234a changes state.

A select output gate 236 can be coupled to receive the output values 232aa, 232ba, 232ca and also coupled to receive the output signal 234a. By way of a select control signal provided from outside of the magnetic field sensor 200 by a user, the select output gate 236 can provide as an output signal either the output signal 234a, all of the output values 232aa, 232ba, 232ca, or any one or more of the output values 232aa, 232ba, 232ca.

The magnetic field sensor can include one or more of a sensitivity adjust memory 216, a detection threshold memory 238, and an offset adjust memory 242, each of which can be programmed with values by a user via a programs signal from outside of the magnetic field sensor 200. The memories can be non-volatile memories.

The sensitivity adjust memory 216 can provide sequential sensitivity values 216a that can take on three different values determined in accordance with the sample clock signal, Sclk. Thus, the sensitivity adjust memory can provide a sensitivity value 216a that is appropriate for which Hall element is presently powered up in a sequential fashion. A digital-to-analog converter 218 can be coupled to receive the sequential sensitivity values 216a and can provide sequential sensitivity signal 218a.

The power chopping switches 208 can be coupled to receive a signal from a current source 219 as a drive signal. The drive signal can be adjusted to three different values depending upon the three different values of the sequential sensitivity signal 218a. In this way, the planar Hall element 202, the first vertical Hall element 204, and the second vertical Hall element 206 can each be driven with different amounts of drive signal to achieve either different sensitivities to a magnetic field, or preferably, the same sensitivities to the magnetic field.

In an alternate embodiment, the sensitivities of the three Hall elements are instead adjusted by way of sequential sensitivity values 216b coupled to a digital-to-analog converter 224, which sequentially adjusts a gain of the amplifier 222.

The detection threshold memory 238 can be used to store three thresholds (e.g., three symmetrical sets of two thresholds) that can be used to compare with each one of the three sequential signals within the output signal 228a from the switched capacitor filter 228. The three stored threshold can be the same or they can be different. Function of the magnetic field sensor 200 when the thresholds are the same and when the thresholds are different are described below in conjunction with FIG. 6.

The offset adjust memory 242 can be used to store three offset correction values that can be sequentially applied to the omni comparator 230 (or, in other embodiments, to the amplifier 222) in accordance with the three sequential signals within the output signal 228a from the switched capacitor filter 228. It will be recognized that, while chopping is described in conjunction with the magnetic field sensor 200, still some residual DC offset may exist and the offset correction values applied through a digital-to-analog converter 244 to the omni comparator 230 can be used compensate for the residual offsets.

The magnetic field sensor 200 can include a micropower regulator 248 coupled to receive the magnetic field sensor power supply voltage, Vcc, and configured to generate a first regulated voltage, Vreg1, which can continuously power an oscillator 250, a power clock generator 252. The micropower regulator 248, the oscillator 250, the power clock generator 252, the output registers 232, the logic gate 234, and the select output gate 236 can remain powered up by Vreg1 at all times during operation of the magnetic field sensor 200. The oscillator 250 can generate a continuous clock signal 250a, and the power clock generator 252 can generate a continuous power clock signal, Pclk. The various clock signals are described more fully below in conjunction with FIG. 3.

The power clock generator is configured to generate a power clock signal, Pclk received by a second voltage regulator 254 configured to generate a second regulated voltage, Vreg2, which turns on and off in accordance with states of the power clock signal, Pclk. The second regulator voltage, Vreg2, is used to power all portions of the magnetic field sensor except for the oscillator 250, the power clock generator 252, the output registers 232, the logic gate 234 and the select output gate 236. Thus, in operation, substantial portions of the magnetic field sensor 200 power on and off (or to a low power state) at a cycle rate and a duty cycle determined by the power clock signal, Pclk. Essentially, the magnetic field sensor powers up from time to time, senses a magnetic field in the environment, determines if the magnetic field is above operating point thresholds stores such information into the registers 232 and makes available an indication of same at all times. As a result, micropower operation is achieved.

The magnetic field sensor 200 can also include a sample clock module 256 coupled to receive the clock signal 250a and the chopping clock module 258 also coupled to receive the clock signal 250a. The sample clock module 256 and the chopping clock module 258 can also be coupled to receive the power clock signal, Pclk. The sample clock module 256 is configured to generate the sample clock, Sclk. The chopping clock module 258 is configured to generate the chopping clock with a frequency, Fchop.

Figure 3:
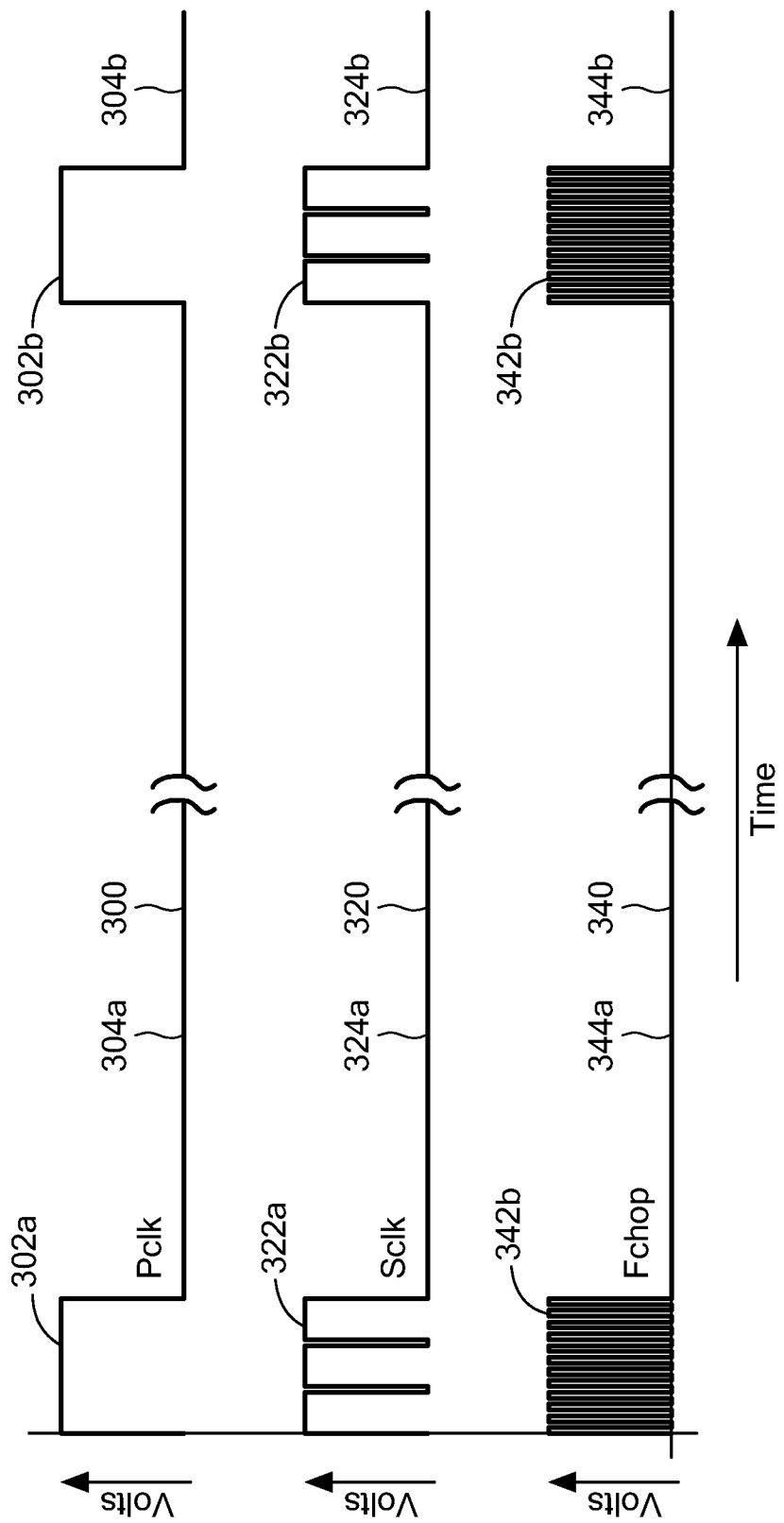
FIG. 3 is a graph showing three exemplary clock signals that can be used within the magnetic field sensor of FIG. 2.

Referring now to FIG. 3, a signal 300 is representative of the power clock signal, Pclk, of FIG. 2. The power clock signal 300 can have sequential high states 302a, 302b with time durations of Thigh, between which are low states 304a, 304b with time durations of Tlow. From discussion above in conjunction with FIG. 2, it will be appreciated that the majority of the circuits within the magnetic field sensor 200 are powered on during high states of the power clock signal, Pclk, and powered off during the low states of the power clock signal, Pclk. However, it should be recognized that the shorter time duration states can instead be low states and the longer time duration state can instead be a high state without departing from the invention.

In order to achieve micropower operation, in some embodiments, Thigh/(Thigh+Tlow) is less than or equal to 0.001, i.e., the power on duty cycle is less than 0.1 percent. However, in other embodiments, the duty cycle can be in a range of ten percent to 0.001 percent, or any duty cycle less than about ten percent.

In some embodiments, a sample time period, Thigh+ Tlow, is about fifty milliseconds. Thus, the three Hall elements of FIG. 2 must be sampled in a time period of about fifty microseconds. However, other sample time periods are also possible in a range of about ten seconds to about ten milliseconds.

The above sample time period of fifty milliseconds is selected in accordance with a bandwidth of a sensed magnetic field. By Nyquist, 1/(sample time period) must be greater than two times the bandwidth of the signal to be sampled. Thus, if the sample time period is fifty milliseconds, the maximum bandwidth of the signal to be sample is ten Hz.

While the above represents a narrow detected bandwidth, the bandwidth of the electronic circuits of the magnetic fields sensor 200 of FIG. 2 must be substantially greater than ten Hz in order to pass the short time duration samples of the three Hall Effect elements. It is known that wider bandwidth results in larger amounts of thermal noise. The thermal noise manifests itself as an apparent shift in the trip points at the omni comparator 230. Thus, in some embodiments, the threshold values stored in the detection threshold memory 238 are adjusted to account for the thermal noise resulting from the wide bandwidth.

A signal 320 is representative of the sample clock signal, Sclk, of FIG. 2. Within each high state of the signal 300, the signal 320 has three high states and two low states 322a, 322b. Each high state of the signal 320 corresponds to one sample of one of the Hall elements in the magnetic field sensor 200 of FIG. 2. Thus, during a first high state, one of the three Hall elements is sampled and sent through the electronic channel of the magnetic field sensor 200, during a second high state another one of the three Hall elements is sampled and sent through the electronic channel, and during a third high state another one of the three Hall elements is sampled and sent through the electronic channel.

It should be appreciated that the various modules of the magnetic field sensor 200 of FIG. 2 that receive the sample clock signal, Sclk, must decode the sample clock signal. However, in other embodiments, the sample clock signal, Sclk, can be provided as three separate signals, each having one of the high states in sequence.

A signal 340 is representative of the chopping clock signal with the frequency, Fchop of FIG. 2. For four state chopping, there are four or more clock pulses in the signal 340 for each one of the high states 322a of the sample clock signal 320. At other times, the chopping clock signal is inactive, or low.

It will be appreciated that all of the sampling of the Hall elements of FIG. 2, and all of the chopping of the Hall elements, occurs during the high or active state of the power clock signal, Pclk, 300. At other times, most of the magnetic field sensor 200 is powered off.

Figure 4:
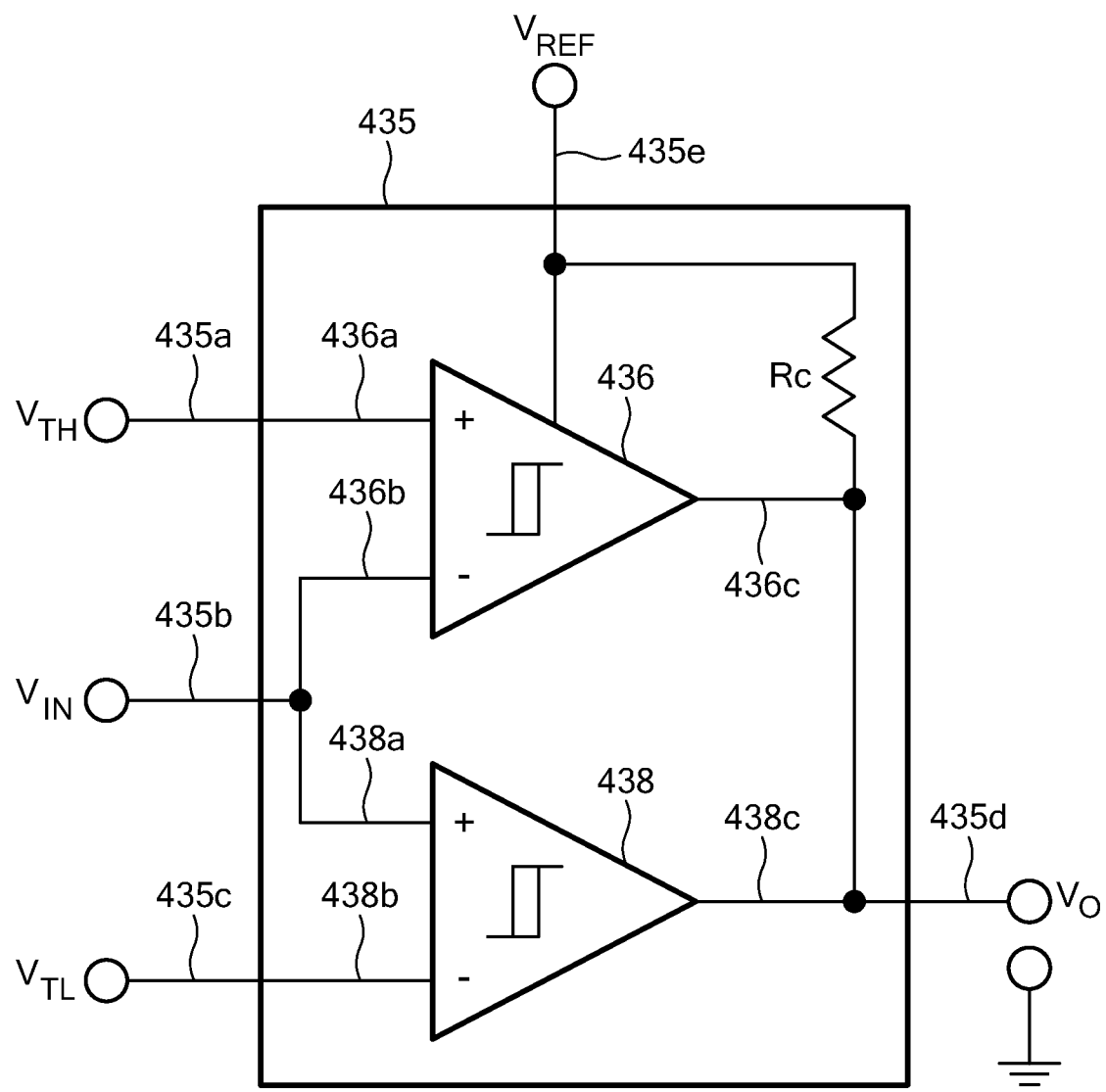
FIG. 4 is a block diagram of an exemplary omni comparator that can be used as the omni comparator of FIG. 2.
Figure 5:
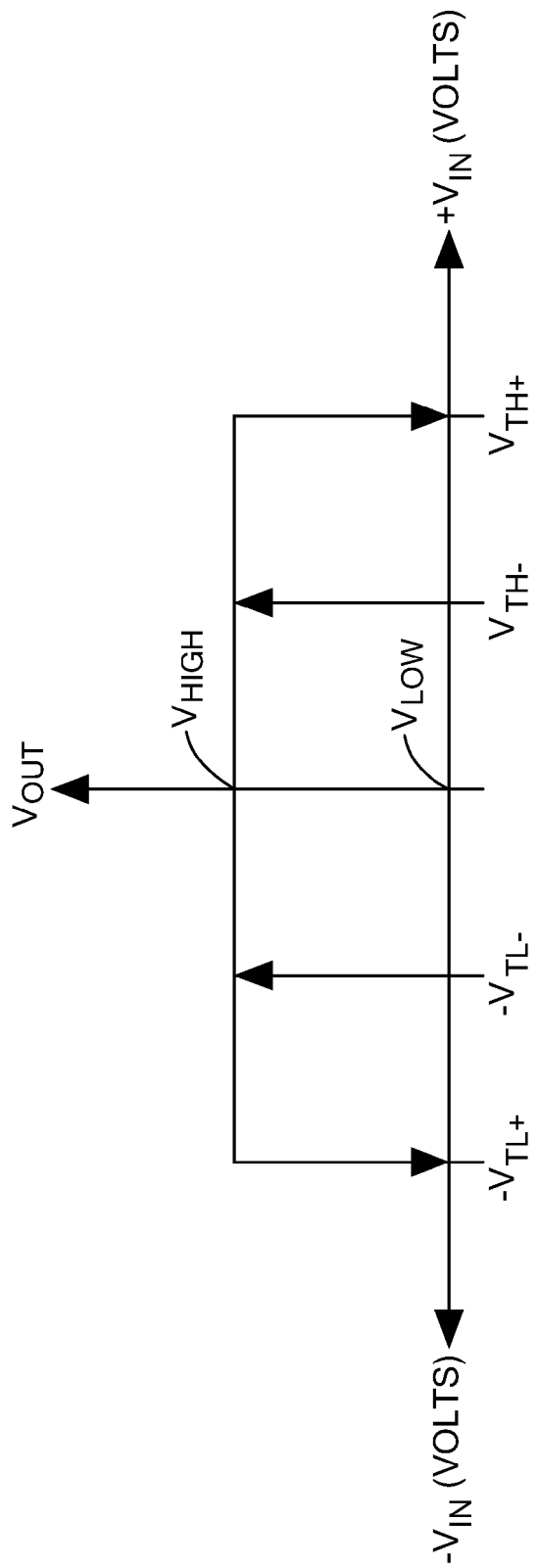
FIG. 5 is a block diagram of an exemplary transfer function that describes function of the omni comparator of FIG. 4.

Referring now to FIGS. 4 and 5 together, a comparator circuit 435 can be the same as or similar to the omni comparator 230 of FIG. 2. The comparator circuit 435 has a plurality of terminals, 435a-435e, and includes first and second and comparators 436, 438. The comparator 436 has a first terminal 436a coupled to a first reference voltage $V_{TH}$ at terminal 435a, a second input terminal 436b coupled to an input voltage $V_{IN}$ at terminal 435b and an output terminal 436c coupled to comparator circuit output terminal 435d where an output voltage $V_{OUT}$ is provided. A reference voltage, $V_{REF}$ is coupled to terminal 435e and provides a reference voltage to comparators 436, 438.

Reference is made below to threshold voltages $V_{TH+}$, $V_{TH-}$, $V_{TL+}$, $V_{TL-}$. It will be recognized that the threshold voltages $V_{TH+}$ and $V_{TL+}$ are representative of the above-described operating point thresholds (i.e., threshold signals 240a, 240b of FIG. 2) and the threshold voltages $V_{TH-}$ and $V_{TL-}$ are representative of the above-described release point thresholds, which are a result of hysteresis within the comparator circuit 435.

The comparator 438 includes a first input terminal 438a coupled at input port 435b to the input voltage $V_{IN}$ and a second input terminal, 438b, coupled to a threshold voltage $V_{TL}$ at terminal 435c. An output terminal 438c of comparator 438 is coupled to provide the output voltage $V_{OUT}$ at the output terminal 435d.

In this particular embodiment, comparators 436, 438 are provided having a means for including hysteresis such that the reference or threshold voltages $V_{TH}$, $V_{TL}$ can be represented as $V_{TH+}$ and $V_{TH-}$ and $V_{TL+}$ and $V_{TL-}$, respectively. The values $V_{TH+}$, $V_{TH-}$, $V_{TL+}$, $V_{TL-}$ represent the comparator switch points depending upon the value of the output voltage $V_{OUT}$. In operation, and as seen in FIG. 5, once the output voltage $V_{OUT}$ switches (e.g. from a high level to a low level), then the switch point changes from $V_{TH+}$ to $V_{TH-}$. Likewise, once the output voltage $V_{OUT}$ switches from a low level to a high level, then the switch point changes from $V_{TH-}$ to $V_{TH+}$.

As can be seen in FIG. 5, the same holds true as the input voltage $V_{IN}$ assumes negative voltages (i.e. voltage values on the left hand side of the Vout-axis in FIG. 5). That is, once the output voltage $V_{OUT}$ switches then the switch point changes from $-V_{TL+}$ to $-V_{TL-}$ and vice-versa depending upon whether the output is switching from low to high or from high to low.

If the output voltage $V_{OUT}$ is high and the input voltage $V_{IN}$ has a value greater than or equal to zero, when the input voltage $V_{IN}$ meets or exceeds the voltage $V_{TH+}$, the output voltage switches from a value of $V_{HIGH}$ to $V_{LOW}$ and the switch point changes from $V_{TH+}$ to $V_{TH-}$. Thus the value of the output voltage $V_{OUT}$ will not switch from $V_{LOW}$ to $V_{HIGH}$ until the input voltage $V_{IN}$ reaches the value $V_{TH-}$.

It should be appreciated that, in other embodiments and applications, it may be preferable to utilize comparators which do not have hysteresis and thus switching occurs at a single voltage level, e.g., $V_{TH+}$ and $-V_{TL+}$, i.e., only operating point thresholds are used.

With reference to only one of the Hall elements of FIG. 2, and to one corresponding directional axis of FIG. 1, in operation, and with reference now to FIG. 5, the input voltage $V_{IN}$ is generated in response to a magnetic field being provided to and removed from a magnetic field sensing device which senses the magnetic field and provides a corresponding signal in response thereto.

Assuming the input voltage $V_{IN}$ is at or near zero volts (i.e. $V_{IN}=0$ volts), the output voltage $V_{OUT}$ is at a first predetermined voltage level $V_{HIGH}$. In response to a magnetic field, the Hall element (e.g., 202, 204, 206 of FIG. 1) that causes the input voltage provides either a positive or a negative input voltage $V_{IN}$. If the input voltage provided by the Hall element moves in a positive direction from zero volts toward the threshold voltage, $V_{TH+}$, when the threshold voltage meets and/or exceeds the threshold voltage level $V_{TH+}$, then the output voltage $V_{OUT}$ changes from the predetermined signal level, $V_{HIGH}$ to a second predetermined voltage level $V_{LOW}$. When the input voltage moves past the threshold voltage $V_{TH-}$ in a negative-going direction, the output voltage changes from $V_{LOW}$ back to $V_{HIGH}$.

Likewise, as the input voltage moves in a negative direction from zero volts and reaches and/or exceeds the threshold voltage $-V_{TL+}$, the output voltage $V_{OUT}$ changes from the first value $V_{HIGH}$ to the second value $V_{LOW}$. Similarly, as the input voltage $V_{IN}$ moves from $-V_{TL+}$ and reaches and/or exceeds the voltage level $-V_{TL-}$, the voltage level then changes from the output voltage level $V_{LOW}$ to $V_{HIGH}$.

While the graph of FIG. 5 is representative of a particular polarity of output signal from the comparator circuit 435, it should be recognized that a similar circuit can generate the opposite polarity.

Figure 6:
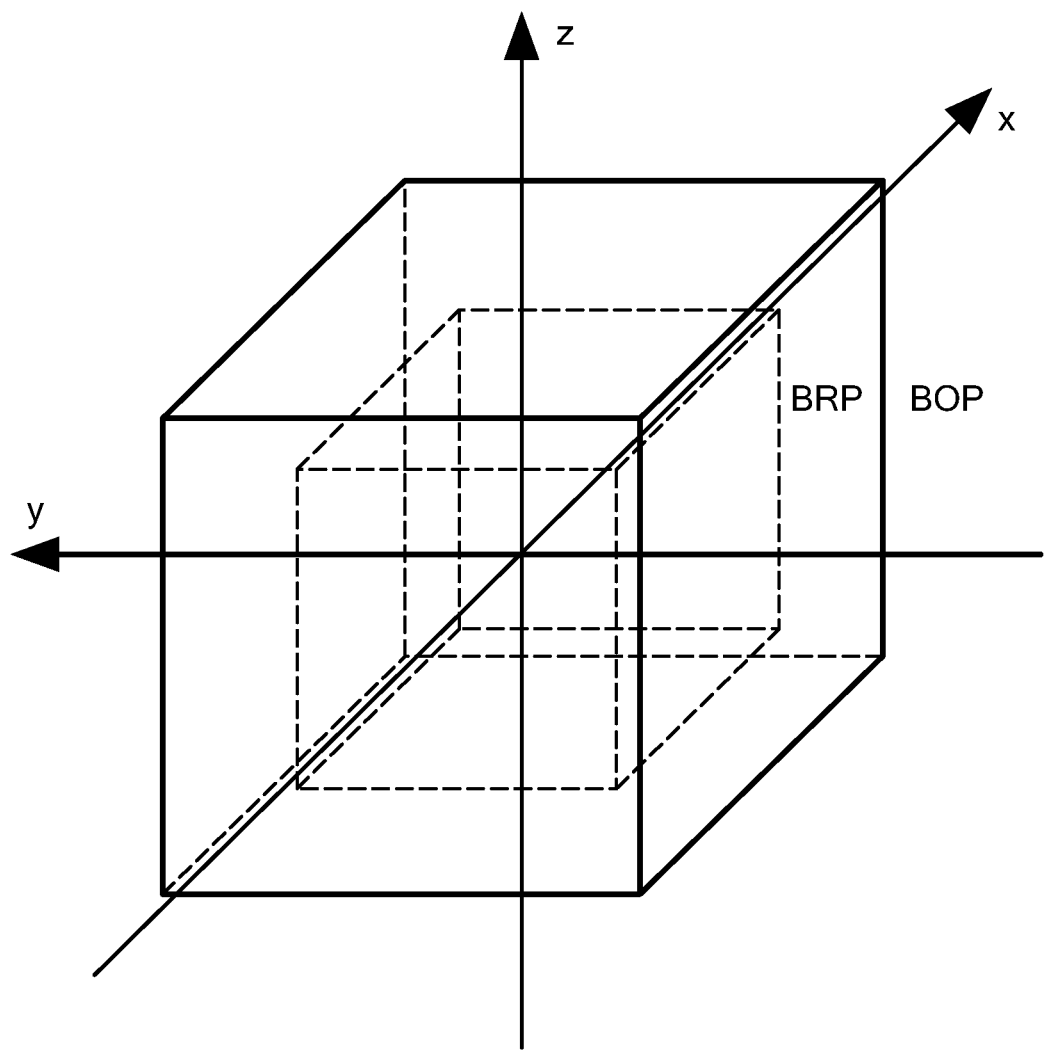
FIG. 6 is a pictorial showing three-dimensional operating point thresholds (BOP) and three-dimensional release point thresholds (BRP)

Referring now to FIG. 6, a graph has x, y, and z axes representative of the same axes in FIG. 1. The axes are each indicative of magnetic field strengths. An outer box is representative of the operating point thresholds (BOP) in three dimensions corresponding to the three dimensions of the Hall elements 202, 204, 206 of FIG. 2. An inner box is representative of the release point thresholds (BRP) in three dimensions corresponding to the three dimensions of the Hall elements.

In operation of the magnetic field sensor 200 of FIG. 2, it should be understood that a magnetic field experienced by the magnetic field sensor 200 having any of its Cartesian coordinates on the reference axes described in FIG. 1 greater in absolute value than the operating point thresholds, i.e., outside of the outer box, results in a change of state of the output signal 234a of the magnetic field sensor 200 to a first state indicative of a detection of the magnetic field. It should also be recognized that a magnetic field experienced by the magnetic field sensor 200 having any of its Cartesian coordinates on the reference axes described in FIG. 1 lower in absolute value than the release point thresholds, i.e., inside of the inner box, results in a change of state of the output signal 234a of the magnetic field sensor 200 to a second different state indicative of a lack of detection of the magnetic field.

In view of the above, the magnetic field sensor 200 operates as a three-dimensional switch operable to detect a magnetic field that can be pointing in any direction with a magnitude that is beyond the outer box.

While square boxes are shown, any one of more dimensions of the two boxes can be reshaped (i.e., to a shape other than a cube) by changing threshold values stored in the detection threshold memory 238 of FIG. 2.

Figure 7:
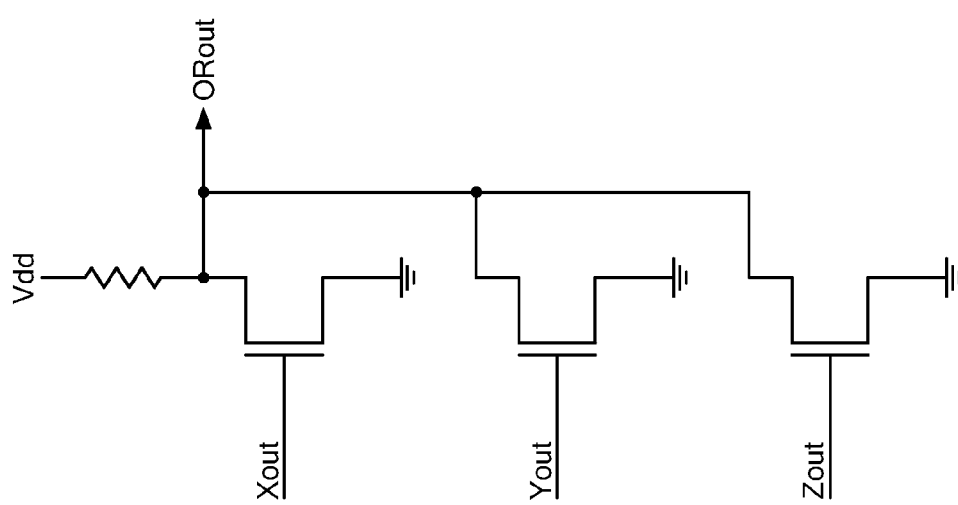
FIG. 7 is a block diagram showing a wired or gate structure that can be used in conjunction with the magnetic field sensor of FIG. 2.
Figure 8A:
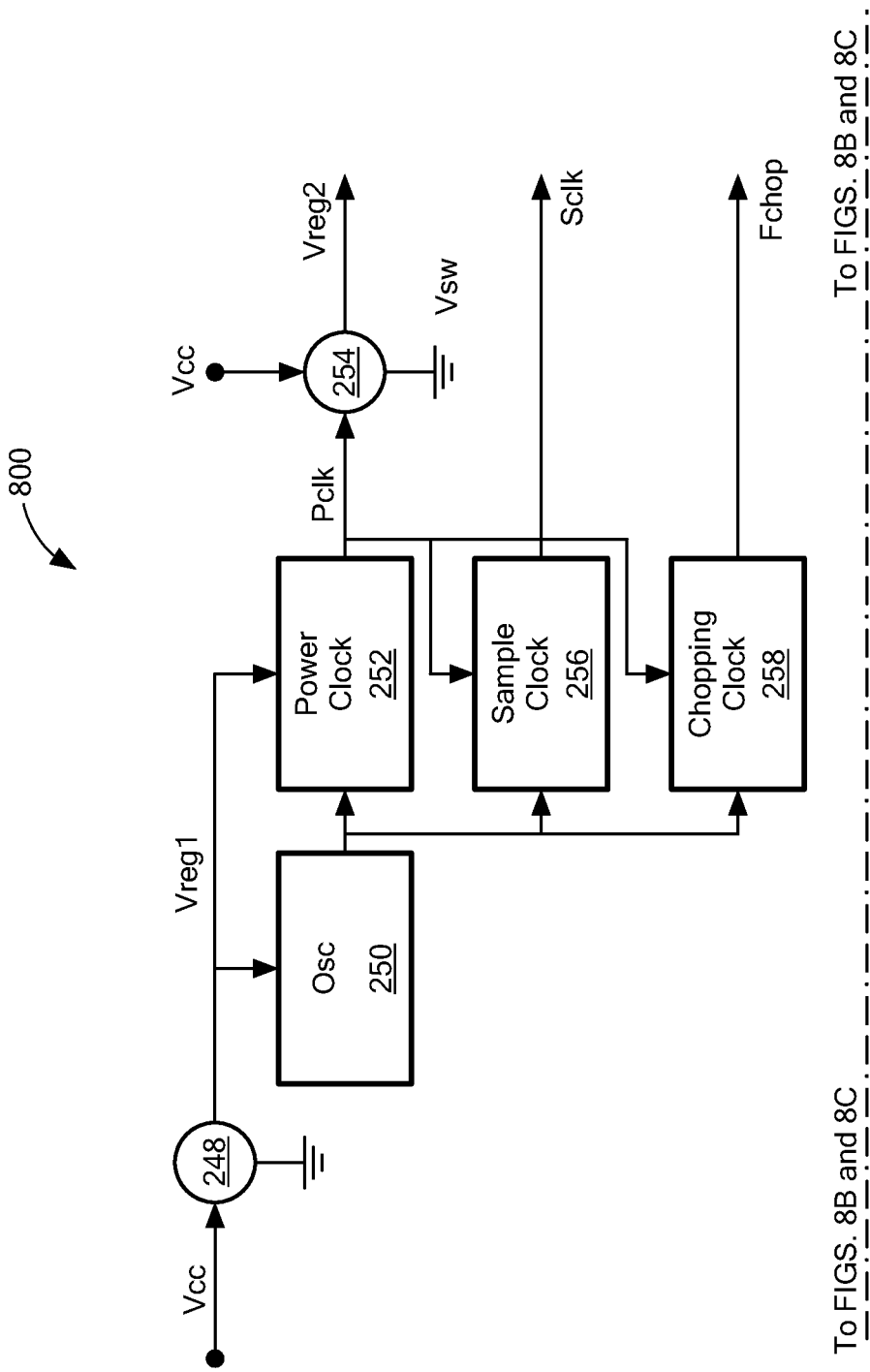
Figure 8B:
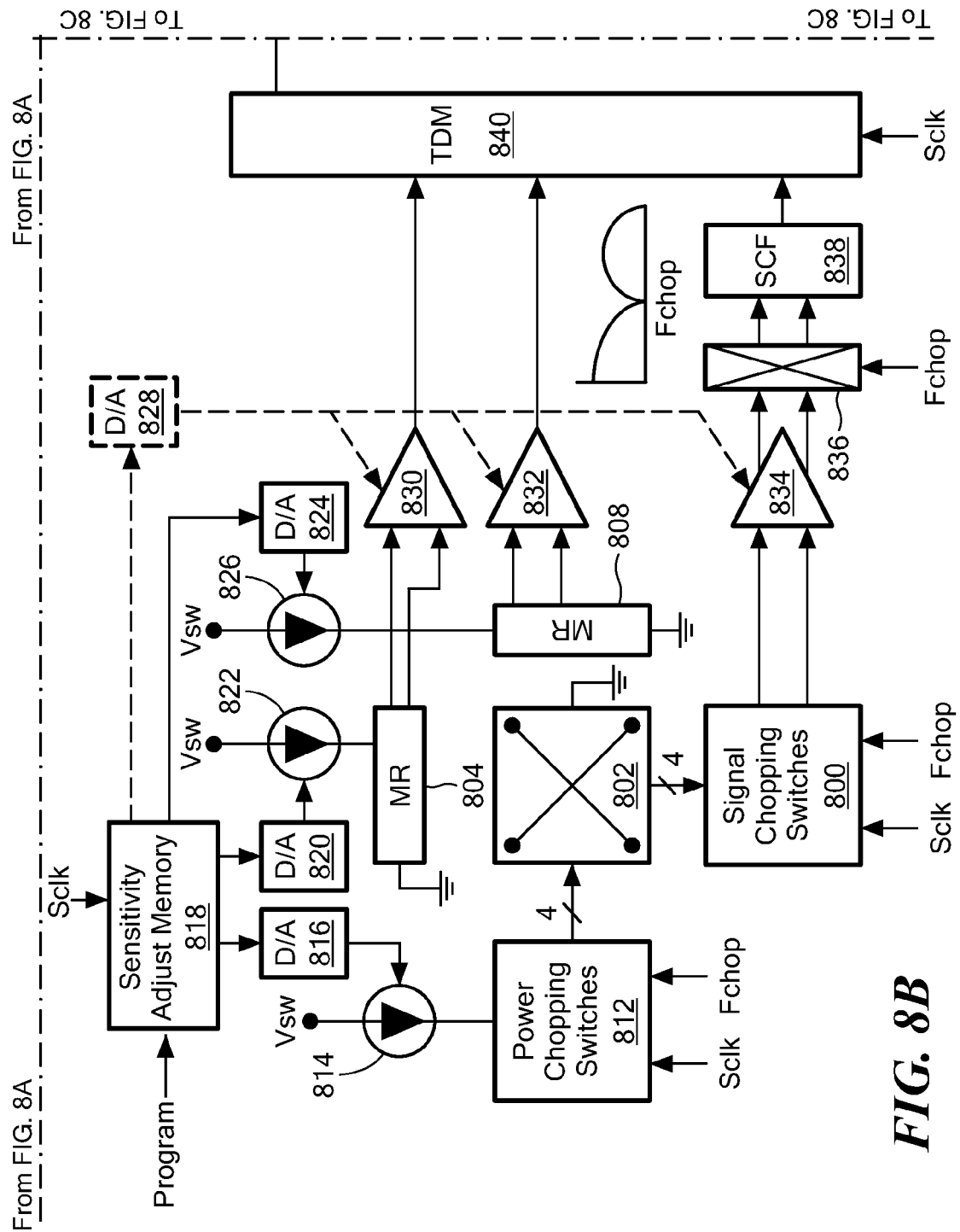
Figure 8C:
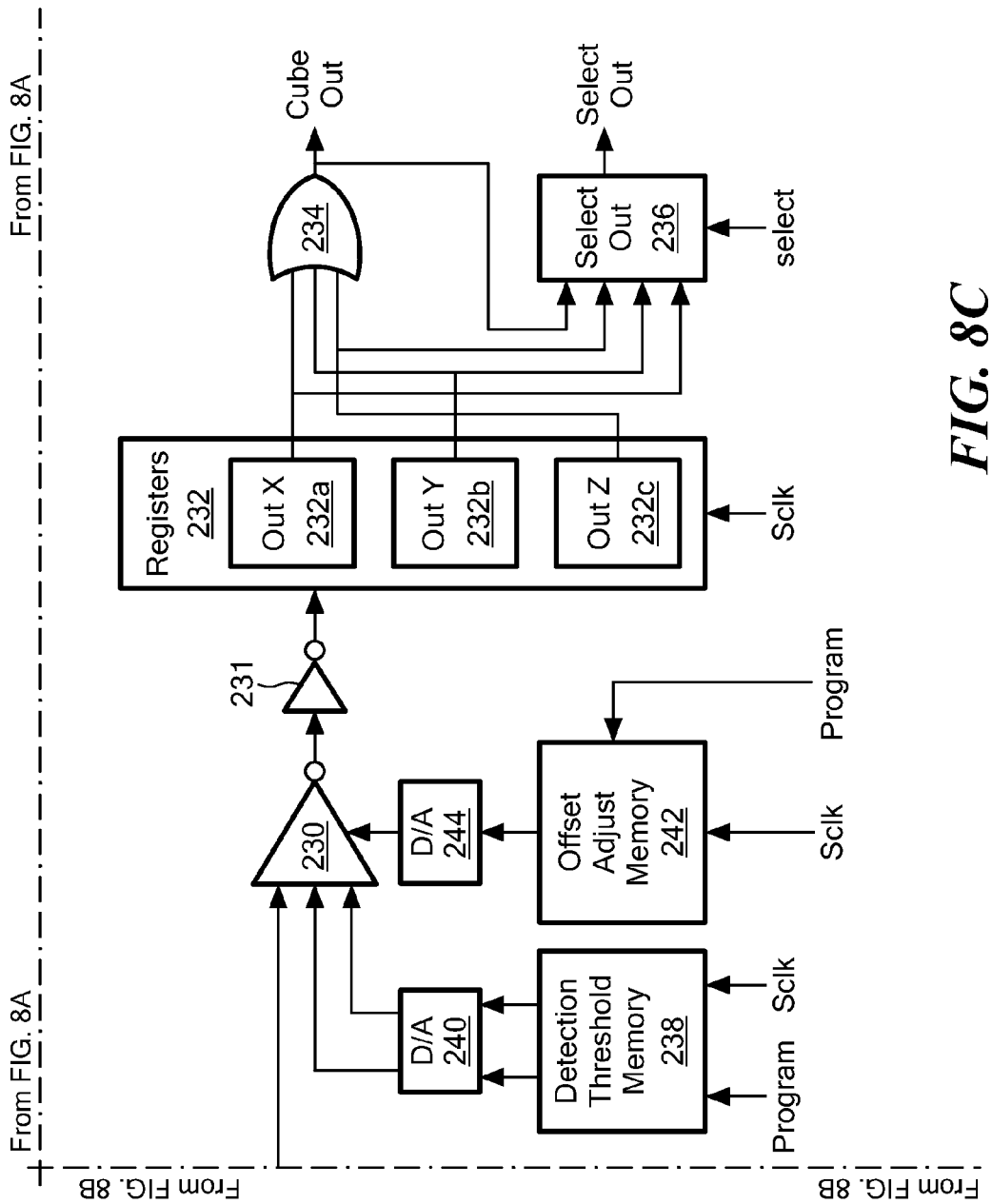

Referring now to FIG. 7, for embodiments in which the output signals 232aa, 232ba, 232ca are provided as output signals by way of the selection output module 236 of FIG. 2, a wired OR function can be brought provided by three FETS, or otherwise, by three transistors, each coupled to a pull-up resistor terminating in a user selectable power supply voltage, Vdd.

An output signal ORout from the wired OR circuit can behave very much like the output signal 234a of FIG. 2, but for which high states are determined by the power supply voltage, Vdd.

Figure 8:
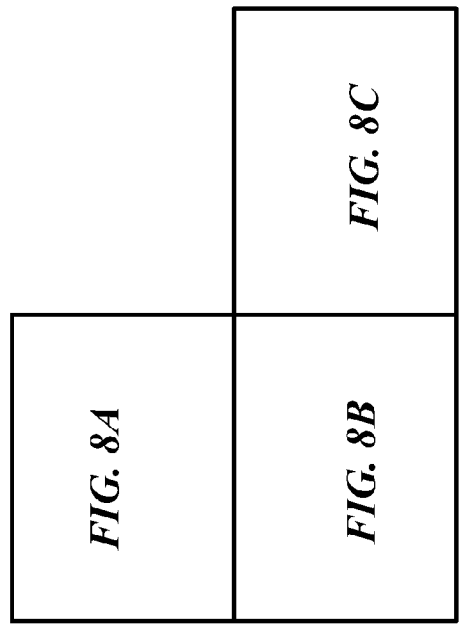
FIG. 8, which includes FIGS. 8A, 8B, and 8C in combination, is a block diagram of another exemplary magnetic field sensor, in the form of a magnetic switch, which can be used as the magnetic field sensor of FIG. 1, and which has a planar Hall element and two magnetoresistance element circuits.

Referring now to FIG. 8, in which like elements of FIG. 2 are shown having like reference designations, an alternate exemplary magnetic field sensor includes a planar Hall element 802. However, in place of the first vertical Hall element 204 and the second vertical Hall element 206, the magnetic field sensor 800 includes a first magnetoresistance circuit 804 and a second magnetoresistance circuit 808. As described above, magnetoresistance elements and circuits tend to have a maximum response axis parallel to a substrate on which they are constructed, in a sense similar to vertical Hall elements.

Magnetoresistance elements and magnetoresistance circuits are not chopped, and thus, the chopping is applied only to the planar Hall element 802.

In order to adjust sensitivities, the magnetic field sensor 800 can include digital-to-analog converters 820, 824 coupled to current sources 822, 826, respectively. The current sources 822, 826 are coupled to drive the magnetoresistance circuits 804, 806, respectively.

The digital-to-analog converters 820, 824 can be coupled to a sensitivity adjust memory 818. The sensitivity just memory 818 can be the same as or similar to the sensitivity adjust memory 216 of FIG. 2. Values stored in the sensitivity adjust memory 818 can adjust sensitivities of the planar Hall element 802, the first magnetoresistance circuit 804, and the second magnetoresistance circuit 808 by way of magnitudes of drive signals provided by the current sources 814, 822, 826, respectively.

Amplifiers 834, 830, 832 are coupled to the planar Hall element 802, the magnetoresistance circuit 804, and the magnetoresistance circuit 808, respectively. In an alternate embodiment, the sensitivity adjust memory 818 can provide sensitivity adjust values to a digital-to-analog converter 828, which can sequentially adjust gains of the amplifiers 834, 830, 832, resulting in a sensitivity adjustment of the magnetic field sensing elements.

A chopping modulator 836 can be the same as or similar to the chopping modulator 226 of FIG. 2. A switched capacitor notch filter 838 can be the same as or similar to the switched capacitor notch filter 228 of FIG. 2.

A time division multiplexing module 840 can be coupled to receive signals from the amplifiers 830, 832 and from the switched capacitor notch filter 838. In operation, by way of a sample clock signal, Sclk, which can be the same as or similar to the sample clock signals of FIGS. 2 and 3, the time division multiplexing module 840 can sequentially select from among the input signals to provide a sequential output signal to the omni comparator 230, which can be the same as or similar to the omni comparator 230 of FIG. 2 and the comparator circuit 435 of FIG. 4.

Other portions of the magnetic field sensor 800 can be the same as or similar to portions of the magnetic field sensor 200 of FIG. 2. However, a chopping clock signal generated by a chopping clock module 868 at the frequency Fchop can be different than the signal 340 of FIG. 3. In particular, for four phase chopping, the signal 340 includes a minimum of twelve chopping pulses, for a minimum of four pulses for each one of three Hall elements in the magnetic field sensor 200 of FIG. 2. In contrast, the magnetic field sensor 800 has only one Hall element, and therefore, a minimum of four chopping clock pulses are needed for four phase chopping.

While four phase chopping as described herein, it will be recognized that chopping can use more than four phases or fewer than four phases, in which case the chopping clocks can have more than the number of pulses shown or fewer than the number of pulses shown, accordingly.

Figure 9:
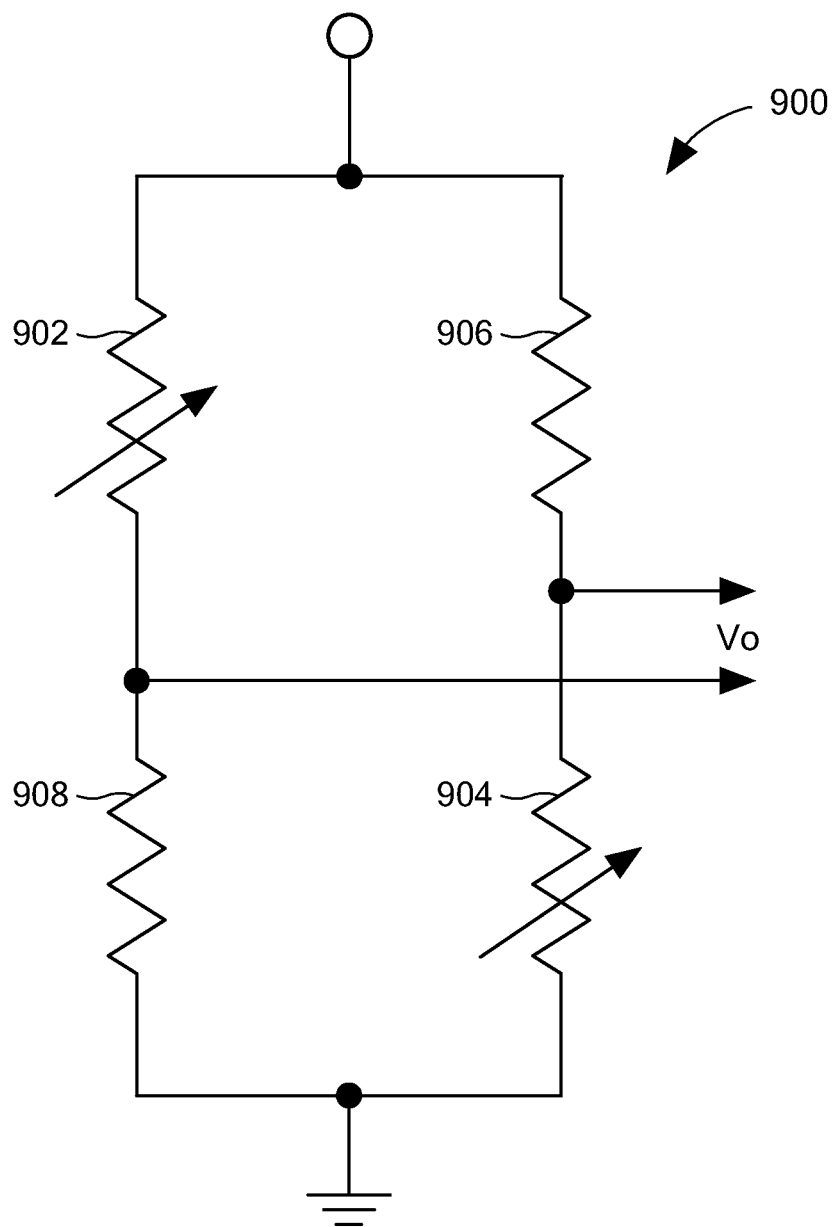
FIG. 9 is a block diagram of an exemplary magnetoresistance element circuit that can be used as the magnetoresistance element circuits of FIG. 8.

Referring now to FIG. 9, an exemplary magnetoresistance circuit 900 is configured in a bridge arrangement having two magnetoresistance elements 902, 904, and two static resistors 906, 908. The magnetoresistance circuit 900 can be the same as or similar to each one of the magnetoresistance circuits 804, 808 of FIG. 8. To achieve the two magnetoresistance circuits 804, 806, which have maximum response axes pointed along different coordinate axes, the magnetoresistance circuit 900 is merely fabricated a two instances on the substrate with the magnetoresistance elements 902, 904 parallel to each other but at different angles on the substrate.

While one particular form of magnetoresistance circuit 900 is shown, there are many forms of magnetoresistance circuits, in the form of the magnetoresistance circuit can depend on the type of magnetoresistance elements used.

Figure 10:
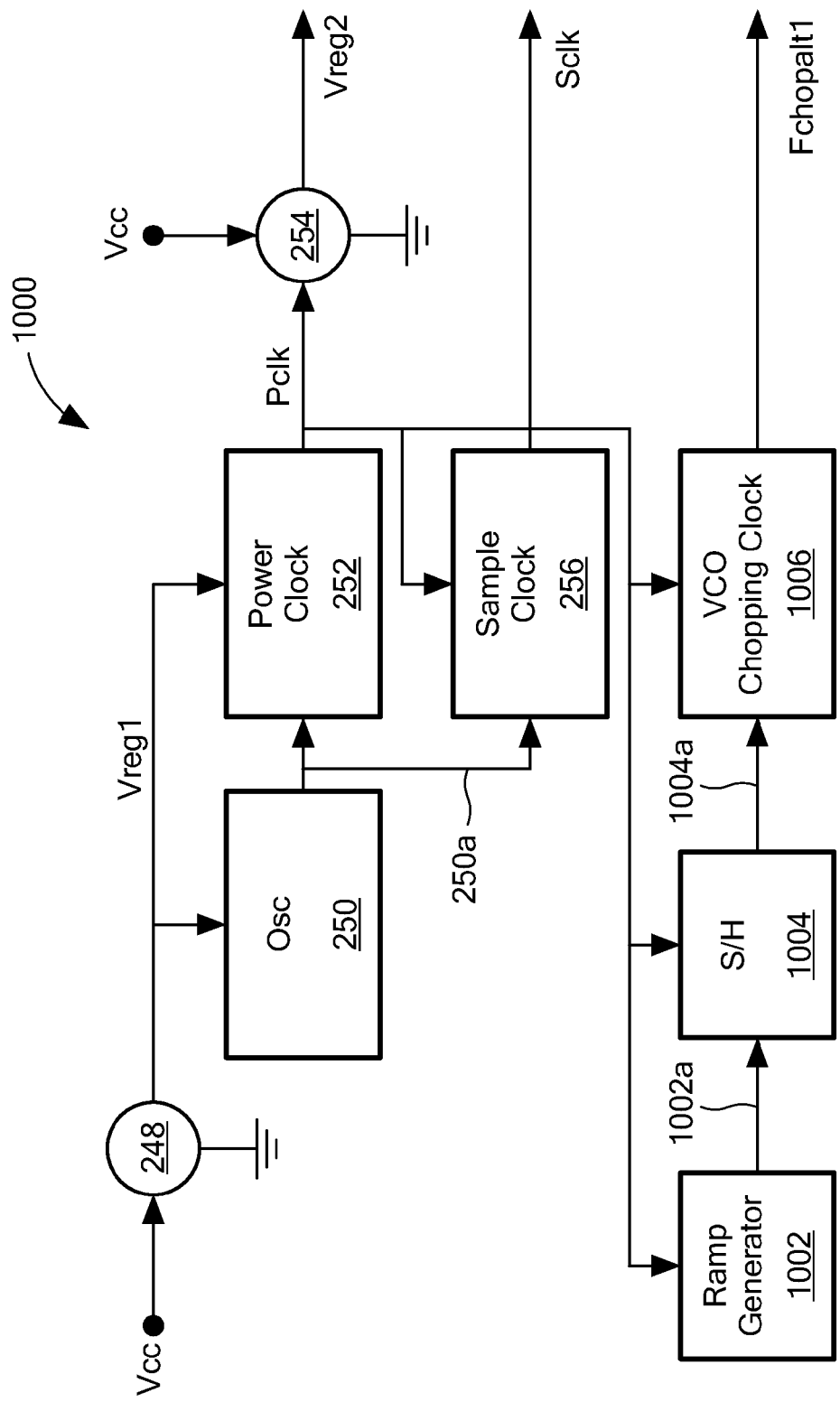
FIG. 10 is a block diagram of an alternate embodiment of power and clocking portions that can be used in the magnetic field sensors of FIGS. 2 and 8.

Referring now to FIG. 10, in which like elements of FIGS. 2 and 8 are shown having like reference designations, an alternate exemplary power and clocking circuit 1000 can be used in place of the power and clocking circuit of FIGS. 2 and 8.

The power and clocking circuit can include a ramp generator 1002 that provides a ramp signal 1002a to a sample and hold module 1004. The sample and hold module 1004 provides a sample and hold signal 1004a, which is a sample and held version of the ramp signal 1002a, to a voltage controlled oscillator (VCO) chopping clock module 1006. The voltage controlled chopping clock module 1006 is configured to generate a chopping clock that has a variable frequency Fchopalt1.

In operation, upon each on state (e.g., high state) of the Pclk signal (e.g., a signal 300 of FIG. 3), the sample and hold module 1004 holds a new value of the ramp signal 1002a generated by the ramp generator. Thus, the sampling held signal 1004a can be a step signal that steps upward (and/or downward) causing frequency Fchopalt1 of the chopping signal to step upward (and/or downward) in frequency during each on state of the Pclk signal.

The upward (and/or downward) steps in frequency can be equal steps or unequal steps.

The varying frequency Fchopalt1 has advantages in rejecting possible noise signals that may occur in the magnetic field sensors 200, 800 of FIGS. 2 and 8.

Benefits of having a chopping frequency that changes are described, for example, in U.S. patent application Ser. No. 12/845,115, file Jul. 28, 2010, and entitled "Magnetic Field Sensor with Improved Differentiation Between a Sensed Magnetic Field and a Noise Signal," which is assigned to the assignee of the present invention and which is incorporated by reference herein in its entirety.

Figure 11:
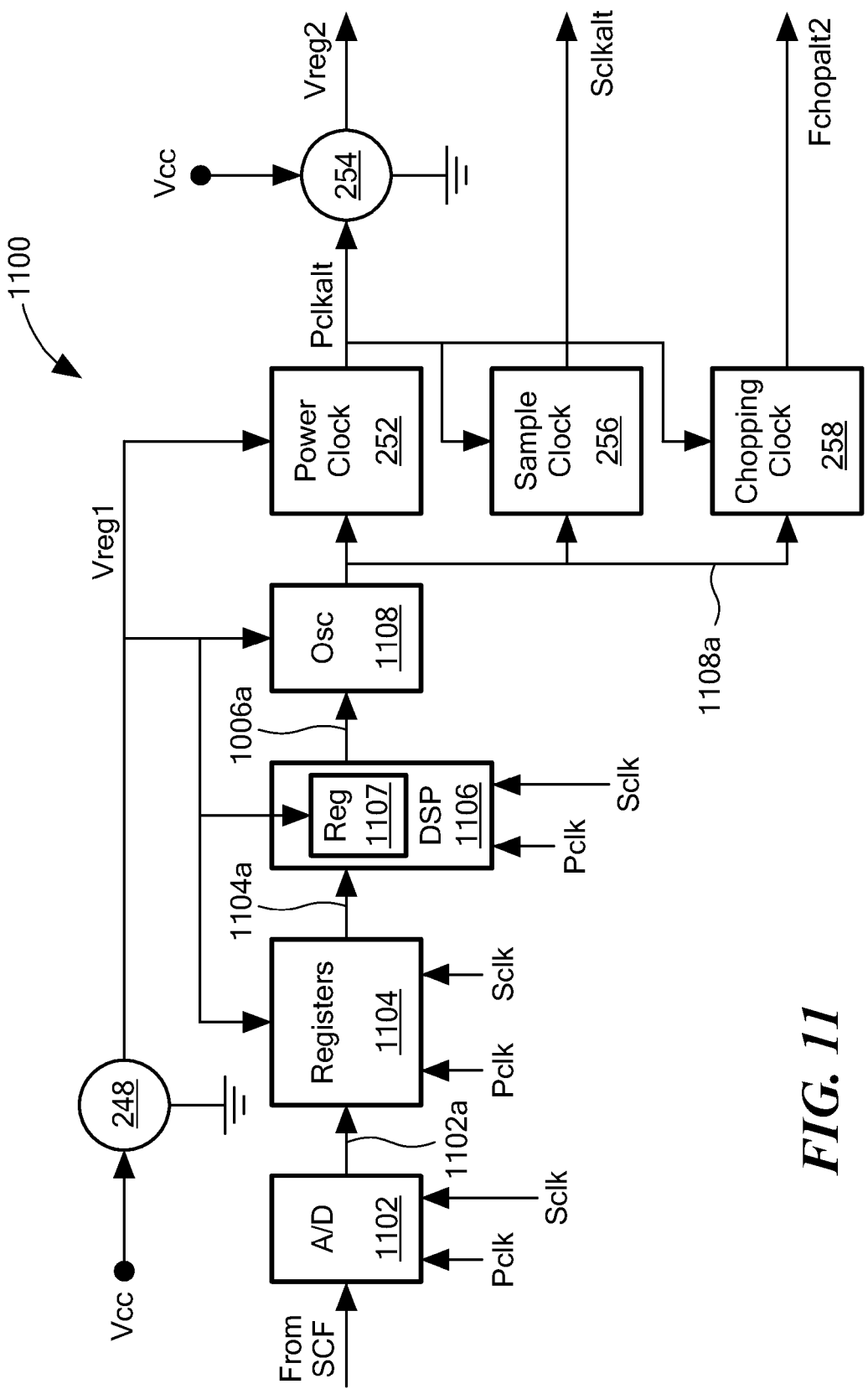
FIG. 11 is a block diagram of another alternate embodiment of power and clocking portions that can be used in the magnetic field sensors of FIGS. 2 and 8.

Referring now to FIG. 11, in which like elements of FIGS. 2 and 8 are shown having like reference designations, another alternate exemplary power and clocking circuit 1100 can be used in place of the power and clocking circuit of FIGS. 2 and 8.

The power and clocking circuit 1100 can include an analog-to-digital converter 1102 coupled to receive the signal 228a from the switched capacitor filter 228 of FIG. 2, or alternatively, from the time division multiplex module 840 of FIG. 8.

The analog-to-digital converter 1102 is configured to generate a digital signal 1102a representative of amplitudes of magnetic field signals generated by the three magnetic field sensing elements of FIGS. 2 and 8, i.e., representative of magnetic fields in the three coordinate axes.

The power clocking circuit 1100 can also include registers 1104 coupled to receive and store the digital signal 1102a from a plurality of samples of the signals from the magnetic field sensing elements, i.e., associated with a plurality of the Pclk high states (see, e.g., a signal 300 of FIG. 3).

A digital signal processor 1106 can be coupled to receive the plurality of values 1104a from the registers 1104. The digital signal processor can include registers 1107 that can provide a control signal 1106a that can speed up or slow down an oscillator 1108.

The registers 1104, the registers 1107, and the oscillator 1108 can remain continually powered on by way of the voltage Vreg1.

In operation, the digital signal processor can determine how fast the magnetic field experienced by the magnetic field sensing elements of FIGS. 2 and 8 is changing. According to the rate of change of magnetic field sensed by the digital signal processor, the digital signal processor can cause the oscillator 1108 to generate a clock signal 1108a that can speed up or slow down depending on the sensed rate of change of the magnetic field. Thus, for a faster rate of change of the sensed magnetic field, the oscillator 1108 can cause the PCLK signal, the Sclk signal, and/or the chopping clock signal, with a frequency Fchopalt2, to run faster. Thus, for a fast rate of change of the sensed magnetic field, sampling of the magnetic field sensing elements of FIGS. 2 and 8 can achieve a faster sampling rate. Conversely, for a slow rate of change of the sensed magnetic field, sampling of the magnetic field sensing elements of FIGS. 2 and 8 can achieve a slower sampling rate, therefore conserving power.

It should be appreciated that the techniques shown and described above in conjunction with FIGS. 10 and 11 can be used separately, or, in alternate embodiments, the two techniques can be used together.

All references cited herein are hereby incorporated herein by reference in their entirety.

Having described preferred embodiments, which serve to illustrate various concepts, structures and techniques, which are the subject of this patent, it will now become apparent to those of ordinary skill in the art that other embodiments incorporating these concepts, structures and techniques may be used. Accordingly, it is submitted that that scope of the patent should not be limited to the described embodiments but rather should be limited only by the spirit and scope of the following claims.

What is claimed is:

1. A magnetic field sensor, comprising:
    first, second, and third magnetic field sensing elements having respective first, second and third maximum response axes, the first second and third maximum response axes pointing along respective first, second, and third different coordinate axes, wherein, in response to a magnetic field, the first, second, and third magnetic field sensing elements are operable to generate first second, and third magnetic field signals; and
    an electronic circuit coupled to receive the first, second, and third magnetic field signals, wherein the electronic circuit comprises:
        a threshold generator configured to generate first, second, and third operating point thresholds; and
        a comparator circuit configured to compare signals corresponding to the first, second, and third magnetic field signals with the first, second, and third operating point thresholds, respectively, and to generate a comparator circuit output signal, wherein the comparator circuit output signal changes state to a first state if a respective one or more of the signals corresponding to the first, second, and third magnetic field signals has a magnitude above a respective one of the first, second, and third operating point thresholds.

2. The magnetic field sensor of claim 1, wherein the electronic circuit is operable to cause the first, second, and third magnetic field sensing elements to generate the first second, and third magnetic field signals sequentially and with a sampling duty cycle less than about ten percent, and wherein substantial portions of the electronic circuit are placed in a lower power condition when the magnetic field signals are not being generated.

3. The magnetic field sensor of claim 1, wherein the a comparator circuit comprises only two comparators.

4. The magnetic field sensor of claim 1, wherein the comparator circuit output signal changes state to a second different state if a respective one or more of the signals corresponding to the first, second, and third magnetic field signals has a magnitude below a respective one of a first, second, and third release point thresholds, wherein the first, second, and third release point thresholds are related to and less than the first, second, and third operating point thresholds, respectively.

5. The magnetic field sensor of claim 1, wherein the first, second, and third coordinate axes represent orthogonal Cartesian coordinates.

6. The magnetic field sensor of claim 1, wherein the first magnetic field sensing element comprises a planar Hall element, the second magnetic field sensing element comprises a first vertical Hall element, and the third magnetic field sensing element comprises a second vertical Hall element.

7. The magnetic field sensor of claim 6, wherein a respective one or more of the one or more comparator output signals changes state to a second different state if a respective one or more of the signals related to the first, second, and third magnetic field signals has a magnitude below a respective one of a first, second, and third release point threshold, wherein the first, second, and third release point thresholds are related to and less than the first, second, and third operating point thresholds, respectively.

8. The magnetic field sensor of claim 6, wherein the electronic circuit further comprises a time divisional multiplexing module operable to time division multiplex the first, second, and third magnetic field sensing elements into a common circuit channel within the electronic circuit.

9. The magnetic field sensor of claim 8, wherein the first, second, and third magnetic field sensing elements are chopped, and wherein the common circuit channel comprises a switched capacitor notch filter having a first notch at a frequency selected to remove products of the chopping.

10. The magnetic field sensor of claim 6, wherein the electronic circuit further comprises a magnetic field sensing element drive circuit operable to time division multiplex drive signals applied to the first, second, and third magnetic field sensing elements.

11. The magnetic field sensor of claim 6, wherein the electronic circuit further comprises a sensitivity adjust memory configured to store first, second, and third sensitivity correction values associated with sensitivities of the first, second, and third magnetic field sensing elements, respectively, wherein the magnetic field sensor is operable to apply the first, second, and third sensitivity correction values to match sensitivities of the signals related to the first, second, and third magnetic field signals, respectively.

12. The magnetic field sensor of claim 6, wherein the electronic circuit further comprises an offset adjust memory configured to store first, second, and third offset correction values associated with offsets of the first, second, and third magnetic field sensing elements, respectively, wherein the magnetic field sensor is operable to apply the first, second, and third offset correction values to match offsets of the signals related to the first, second, and third magnetic field signals, respectively.

13. The magnetic field sensor of claim 6, wherein the electronic circuit further comprises a threshold memory configured to store first, second, and third threshold values for comparison with signals representative of the first, second, and third magnetic field signals, respectively.

14. The magnetic field sensor of claim 1, wherein the first magnetic field sensing element comprises a planar Hall element, the second magnetic field sensing element comprises a first magnetoresistance circuit, and the third magnetic field sensing element comprises a second magnetoresistance circuit.

15. The magnetic field sensor of claim 14, wherein a respective one or more of the one or more comparator output signals changes state to a second different state if a respective one or more of the signals related to the first, second, and third magnetic field signals has a magnitude below a respective one of a first, second, and third release point threshold, wherein the first, second, and third release point thresholds are related to and less than the first, second, and third operating point thresholds, respectively.

16. The magnetic field sensor of claim 14, wherein the electronic circuit further comprises a time divisional multiplexing module operable to time division multiplex the first, second, and third magnetic field sensing elements.

17. The magnetic field sensor of claim 14, wherein the first magnetic field sensing element is chopped with a chopping frequency of Fchop, and wherein the electronic circuit comprises a switched capacitor notch filter coupled to the first magnetic field sensing element and having a first notch at a frequency of Fchop.

18. The magnetic field sensor of claim 14, wherein the electronic circuit further comprises a magnetic field sensing element drive circuit operable to time division multiplex drive signals applied to the first, second, and third magnetic field sensing elements.

19. The magnetic field sensor of claim 14, wherein the electronic circuit further comprises a sensitivity adjust memory configured to store first, second, and third sensitivity correction values associated with sensitivities of the first, second, and third magnetic field sensing elements, respectively, wherein the magnetic field sensor is operable to apply the first, second, and third sensitivity correction values to match sensitivities of the signals related to the first, second, and third magnetic field signals, respectively.

20. The magnetic field sensor of claim 14, wherein the electronic circuit further comprises an offset adjust memory configured to store first, second, and third offset correction values associated with offsets of the first, second, and third magnetic field sensing elements, respectively, wherein the magnetic field sensor is operable to apply the first, second, and third offset correction values to match offsets of the signals related to the first, second, and third magnetic field signals, respectively.

21. The magnetic field sensor of claim 14, wherein the electronic circuit further comprises a threshold memory configured to store first, second, and third threshold values for comparison with signals representative of the first, second, and third magnetic field signals, respectively.

22. A method of measuring a magnetic field with a magnetic field sensor, the method comprising:
providing, on a common substrate, first, second, and third magnetic field sensing elements having respective first, second and third maximum response axes, the first second and third maximum response axes pointing along respective first, second, and third different coordinate axes, wherein, in response to a magnetic field, the first, second, and third magnetic field sensing elements are operable to generate first second, and third magnetic field signals; and providing, on the common substrate, an electronic circuit coupled to receive the first, second, and third magnetic field signals, wherein the providing the electronic circuit comprises:

providing a threshold generator configured to generate first, second, and third operating point thresholds; and providing a comparator circuit configured to compare signals corresponding to the first, second, and third magnetic field signals with the first, second, and third operating point thresholds, respectively, and to generate a comparator circuit output signal, wherein the comparator circuit output signal changes state to a first state if a respective one or more of the signals corresponding to the first, second, and third magnetic field signals has a magnitude above a respective one of the first, second, and third operating point thresholds.

23. The method of claim 22, further comprising:

generating the first second, and third magnetic field signals sequentially and with a sampling duty cycle less than about ten percent; and placing in a lower power condition substantial portions of the electronic circuit when the magnetic field signals are not being generated.

24. The method of claim 22, wherein the providing the first, second, and third magnetic field sensing elements comprises:

providing the first magnetic field sensing element as a planar Hall element;

providing the second magnetic field sensing element as a first vertical Hall element; and providing the third magnetic field sensing element as a second vertical Hall element.

25. The method of claim 24, wherein the comparator circuit output signal changes state to a second different state if a respective one or more of the signals corresponding to the first, second, and third magnetic field signals has a magnitude below a respective one of a first, second, and third release point thresholds, wherein the first, second, and third release point thresholds are related to and less than the first, second, and third operating point thresholds, respectively.

26. The method of claim 24, wherein the providing the electronic circuit further comprises providing a time divisional multiplexing module operable to time division multiplex the first, second, and third magnetic field sensing elements into a common circuit channel within the electronic circuit.

27. The method of claim 24, wherein the first, second, and third magnetic field sensing elements are chopped, and wherein the common circuit channel comprises a switched capacitor notch filter having a first notch at a frequency selected to remove products of the chopping.

28. The method of claim 24, wherein the providing the electronic circuit further comprises providing a magnetic field sensing element drive circuit operable to time division multiplex drive signals applied to the first, second, and third magnetic field sensing elements.

29. The method of claim 24, wherein the providing the electronic circuit further comprises providing a sensitivity adjust memory configured to store first, second, and third sensitivity correction values associated with sensitivities of the first, second, and third magnetic field sensing elements, respectively, wherein the magnetic field sensor is operable to apply the first, second, and third sensitivity correction values to match sensitivities of the signals related to the first, second, and third magnetic field signals, respectively.

30. The method of claim 24, wherein the providing the electronic circuit further comprises providing an offset adjust memory configured to store first, second, and third offset correction values associated with offsets of the first, second, and third magnetic field sensing elements, respectively, wherein the magnetic field sensor is operable to apply the first, second, and third offset correction values to match offsets of the signals related to the first, second, and third magnetic field signals, respectively.

31. The method of claim 24, wherein the providing the electronic circuit further comprises providing a threshold memory configured to store first, second, and third threshold values for comparison with signals representative of the first, second, and third magnetic field signals, respectively.

32. The method of claim 22, wherein the providing the first, second, and third magnetic field sensing elements comprises:

providing the first magnetic field sensing element as a planar Hall element;

providing the second magnetic field sensing element as a first magnetoresistance circuit; and providing the third magnetic field sensing element as a second magnetoresistance circuit.

33. The method of claim 32, wherein a respective one or more of the one or more comparator output signals changes state to a second different state if a respective one or more of the signals related to the first, second, and third magnetic field signals has a magnitude below a respective one of a first, second, and third release point thresholds, wherein the first, second, and third release point thresholds are related to and less than the first, second, and third operating point thresholds, respectively.

34. The method of claim 32, wherein the providing the electronic circuit further comprises providing a time divisional multiplexing module operable to time division multiplex the first, second, and third magnetic field sensing elements.

35. The method of claim 32, wherein the first magnetic field sensing element is chopped with a chopping frequency of Fchop, and wherein the electronic circuit comprises a switched capacitor notch filter coupled to the first magnetic field sensing element and having a first notch at a frequency of Fchop.

36. The method of claim 32, wherein the providing the electronic circuit further comprises providing a magnetic field sensing element drive circuit operable to time division multiplex drive signals applied to the first, second, and third magnetic field sensing elements.

37. The method of claim 32, wherein the providing the electronic circuit further comprises providing a sensitivity adjust memory configured to store first, second, and third sensitivity correction values associated with sensitivities of the first, second, and third magnetic field sensing elements, respectively, wherein the magnetic field sensor is operable to apply the first, second, and third sensitivity correction values to match sensitivities of the signals related to the first, second, and third magnetic field signals, respectively.

38. The method of claim 32, wherein the providing the electronic circuit further comprises providing an offset adjust memory configured to store first, second, and third offset correction values associated with offsets of the first, second, and third magnetic field sensing elements, respectively, wherein the magnetic field sensor is operable to apply the first, second, and third offset correction values to match offsets of the signals related to the first, second, and third magnetic field signals, respectively.

39. The method of claim 32, wherein the providing the electronic circuit further comprises providing a threshold memory configured to store first, second, and third threshold values for comparison with signals representative of the first, second, and third magnetic field signals, respectively.

40. The magnetic field sensor of claim 1, wherein the one or more comparators is operable to generate one or more signal representative of three comparator output signals, wherein the magnetic field sensor further comprises:
a combining circuit coupled to receive the three comparator output signals and operable to logically combine the three comparator output signals with a logical OR function to generate a logical signal indicative of any of the three comparator output signals being in a predetermined one of the first state or a second different state.

41. The magnetic field sensor of claim 4, wherein the one or more comparators is operable to generate one or more signal representative of three comparator output signals, wherein the magnetic field sensor further comprises:
a combining circuit coupled to receive the three comparator output signals and operable to logically combine the three comparator output signals with a logical OR function to generate a logical signal indicative of any of the three comparator output signals being in a predetermined one of the first state or the second different state.

42. The magnetic field sensor of claim 7, wherein the one or more comparators is operable to generate one or more signals representative of three comparator output signals, wherein the magnetic field sensor further comprises:
a combining circuit coupled to receive the three comparator output signals and operable to logically combine the three comparator output signals with a logical OR function to generate a logical signal indicative of any of the three comparator output signals being in a predetermined one of the first state or the second different state.

43. The method of claim 22, wherein the one or more comparators is operable to generate one or more signals representative of three comparator output signals, wherein the method further comprises:
logically combining the three comparator output signals with a logical OR function to generate a logical signal indicative of any of the three comparator output signals being in a predetermined one of the first state or a second different state.

44. The method of claim 25, wherein the one or more comparators is operable to generate one or more signals representative of three comparator output signals, wherein the method further comprises:
logically combining the three comparator output signals with a logical OR function to generate a logical signal indicative of any of the three comparator output signals being in a predetermined one of the first state or the second different state.

45. The magnetic field sensor of claim 1, wherein the electronic circuit is operable to cause the first, second, and third magnetic field sensing elements to generate the first second, and third magnetic field signals sequentially.

46. The magnetic field sensor of claim 1, wherein the electronic circuit further comprises a time divisional multiplexing module operable to time division multiplex the first, second, and third magnetic field sensing elements into a common circuit channel within the electronic circuit.

47. The method of claim 22, further comprising:
generating the first second, and third magnetic field signals sequentially.

48. The method of claim 22, wherein the providing the electronic circuit further comprises providing a time divisional multiplexing module operable to time division multiplex the first, second, and third magnetic field sensing elements into a common circuit channel within the electronic circuit.

* * * * *

UNITED STATES PATENT AND TRADEMARK OFFICE
CERTIFICATE OF CORRECTION

PATENT NO. : 9,664,752 B2
APPLICATION NO. : 14/277218
DATED : May 30, 2017
INVENTOR(S) : Gerardo A. Monreal et al.

It is certified that error appears in the above-identified patent and that said Letters Patent is hereby corrected as shown below:

In the Specification

Column 5, Line 10, delete "used," and replace with --used.--.

Column 10, Line 32, delete "$V_{TH-}$ to $V_{TH+}$" and replace with --$V_{TH-}$ to $V_{TH+}$.--.

Column 10, Line 35, delete "the Vout-axis" and replace with --the Vout axis.--.

Column 12, Line 14, delete "The sensitivity just" and replace with --The sensitivity adjust--.

Column 13, Line 38, delete "file Jul. 28, 2010," and replace with --filed Jul. 28, 2010,--.

Column 14, Line 32, delete "that that" and replace with --that the--.

Signed and Sealed this
Thirty-first Day of July, 2018

Andrei Iancu
*Director of the United States Patent and Trademark Office*